US012807809B2

(12) United States Patent
Wolf et al.

(10) Patent No.: US 12,807,809 B2
(45) Date of Patent: Nov. 24, 2026

(54) HEAT STABILIZED, FLAME RETARDANT POLYMER COMPOSITION

(71) Applicant: Celanese International Corporation, Irving, TX (US)

(72) Inventors: Arno Wolf, Schonau (DE); Juergen Schmidt, Utzenfeld (DE); Guglielmo Pasetti, Lodi (IT)

(73) Assignee: Celanese International Corporation, Irving, TX (US)

( * ) Notice: Subject to any disclaimer, the term of this patent is extended or adjusted under 35 U.S.C. 154(b) by 967 days.

(21) Appl. No.: 18/079,030

(22) Filed: Dec. 12, 2022

(65) Prior Publication Data

US 2023/0183479 A1 Jun. 15, 2023

Related U.S. Application Data

(60) Provisional application No. 63/417,522, filed on Oct. 19, 2022, provisional application No. 63/417,543, filed on Oct. 19, 2022, provisional application No. 63/388,730, filed on Jul. 13, 2022, provisional application No. 63/388,733, filed on Jul. 13, 2022, provisional application No. 63/288,954, filed on Dec. 13, 2021.

(51) Int. Cl.

| | |
|---|---|
| ***C08L 77/06*** | (2006.01) |
| ***B60L 50/60*** | (2019.01) |
| ***B60L 53/16*** | (2019.01) |
| ***H01R 13/533*** | (2006.01) |
| ***H05K 5/02*** | (2006.01) |

(52) U.S. Cl.

CPC ............... *C08L 77/06* (2013.01); *B60L 50/60* (2019.02); *B60L 53/16* (2019.02); *H01R 13/533* (2013.01); *C08L 2205/025* (2013.01); *C08L 2205/03* (2013.01); *H01R 2201/26* (2013.01); *H05K 5/0209* (2022.08)

(58) Field of Classification Search

CPC . B60L 50/60; B60L 53/16; C08K 2003/2248; C08K 2003/3045; C08K 3/16; C08K 3/22; C08K 3/28; C08K 3/30; C08K 5/098; C08K 5/3435; C08K 5/521; C08K 5/5313; C08K 5/56; C08K 7/14; C08L 2205/02; C08L 2205/025; C08L 2205/03; C08L 25/18; C08L 77/02; C08L 77/06; H01R 13/465; H01R 13/533; H01R 13/641; H01R 2201/26; H05K 5/0209

See application file for complete search history.

(56) References Cited

U.S. PATENT DOCUMENTS

| | | | |
|---|---|---|---|
| 6,255,371 | B1 | 7/2001 | Schlosser et al. |
| 6,547,992 | B1 | 4/2003 | Schlosser et al. |
| 7,612,131 | B2 | 11/2009 | Yamada |
| 7,700,680 | B2 | 4/2010 | Costanzi et al. |
| 7,851,532 | B2 | 12/2010 | Kim et al. |
| 7,923,506 | B2 | 4/2011 | Cohoon et al. |
| 8,080,599 | B2 | 12/2011 | Ding et al. |
| 8,247,477 | B2 | 8/2012 | Miyamoto |
| 8,796,367 | B2 | 8/2014 | Tsunoda et al. |
| 8,921,465 | B2 | 12/2014 | Hirakawa et al. |
| 9,708,538 | B2 | 7/2017 | Köstler et al. |
| 9,745,449 | B2 | 8/2017 | Stockdale et al. |
| 10,077,341 | B2 | 9/2018 | Fogle et al. |
| 10,081,712 | B2 | 9/2018 | Fogle et al. |
| 10,221,301 | B2 | 3/2019 | Leistner et al. |
| 10,344,144 | B2 | 7/2019 | Roth |
| 10,590,245 | B2 | 3/2020 | Fogle et al. |
| 10,703,901 | B2 | 7/2020 | Chen et al. |
| 10,808,119 | B2 | 10/2020 | Wagner et al. |
| 10,836,904 | B2 | 11/2020 | Osborn et al. |
| 11,098,190 | B2 | 8/2021 | Yoshida et al. |
| 11,118,030 | B2 | 9/2021 | Osborn |
| 11,274,192 | B2 | 3/2022 | White et al. |
| 11,299,627 | B2 | 4/2022 | White et al. |
| 11,308,882 | B2 | 4/2022 | Nie et al. |
| 11,384,201 | B2 | 7/2022 | White |
| 11,401,416 | B2 | 8/2022 | Pasetti et al. |
| 2004/0227130 | A1 | 11/2004 | Hoerold et al. |
| 2006/0089435 | A1 | 4/2006 | Hoerold et al. |

(Continued)

FOREIGN PATENT DOCUMENTS

| | | |
|---|---|---|
| CN | 101151320 B | 7/2011 |
| CN | 101747599 B | 12/2011 |

(Continued)

OTHER PUBLICATIONS

TW 1640572B (Nov. 11, 2018) machine translation.*

(Continued)

*Primary Examiner* — Ana L. Woodward
(74) *Attorney, Agent, or Firm* — Dority & Manning, P.A.

(57) ABSTRACT

A polymer composition that comprises from about 20 wt. % to about 70 wt. % of a polymer matrix that includes a polyimide; from about 10 wt. % to about 50 wt. % of inorganic fibers; from about 5 wt. % to about 30 wt. % of a flame retardant system that includes an organophosphorous compound; and from about 0.1 wt. % to about 5 wt. % of a stabilizer system that includes a heat stabilizer is provided. The heat stabilizer includes a copper compound. The polymer composition exhibits an initial tensile strength and an aged tensile strength after exposure to temperature of 200° C. for 1,000 hours. The ratio of the aged tensile strength to the initial tensile strength is about 0.5 or more.

53 Claims, 3 Drawing Sheets

(56) References Cited

U.S. PATENT DOCUMENTS

| | | | |
|---|---|---|---|
| 2009/0234051 | A1 | 9/2009 | Endtner et al. |
| 2012/0208937 | A1 | 8/2012 | Prusty et al. |
| 2013/0228728 | A1 | 9/2013 | Mathur et al. |
| 2014/0323628 | A1 | 10/2014 | Jeol et al. |
| 2016/0090481 | A1 | 3/2016 | Endtner et al. |
| 2016/0215122 | A1 | 7/2016 | Stockdale et al. |
| 2018/0030236 | A1 | 2/2018 | Kawamura et al. |
| 2019/0112455 | A1 | 4/2019 | Osborn |
| 2019/0112476 | A1 | 4/2019 | Pasetti et al. |
| 2019/0248986 | A1 | 8/2019 | Bergmann |
| 2019/0292366 | A1 | 9/2019 | Bienmueller et al. |
| 2019/0300709 | A1 | 10/2019 | Sparks et al. |
| 2020/0227452 | A1 | 7/2020 | Ishii et al. |
| 2020/0247993 | A1 | 8/2020 | Sparks et al. |
| 2020/0247994 | A1 | 8/2020 | Sparks |
| 2020/0255662 | A1 | 8/2020 | Sparks et al. |
| 2020/0308402 | A1 | 10/2020 | White |
| 2021/0054198 | A1 | 2/2021 | Osborn et al. |
| 2021/0147676 | A1 | 5/2021 | Bauer et al. |
| 2021/0261727 | A1 | 8/2021 | Kim et al. |
| 2021/0355322 | A1 | 11/2021 | Lima et al. |
| 2021/0363349 | A1 | 11/2021 | Bauer et al. |
| 2022/0302640 | A1 | 9/2022 | Pasetti et al. |
| 2022/0363898 | A1 | 11/2022 | Pasetti et al. |
| 2023/0105770 | A1 | 4/2023 | Sohn |
| 2023/0144143 | A1 | 5/2023 | Miyamoto et al. |
| 2023/0183452 | A1 | 6/2023 | Wolf et al. |

FOREIGN PATENT DOCUMENTS

| | | | |
|---|---|---|---|
| CN | 101633774 | B | 4/2012 |
| CN | 101851405 | B | 5/2012 |
| CN | 101497738 | B | 6/2012 |
| CN | 101565536 | B | 7/2012 |
| CN | 102061071 | B | 7/2012 |
| CN | 102093675 | B | 8/2012 |
| CN | 101469106 | B | 9/2012 |
| CN | 102070887 | B | 9/2012 |
| CN | 102020833 | B | 10/2012 |
| CN | 101945946 | B | 2/2013 |
| CN | 102372907 | B | 3/2013 |
| CN | 102702691 | B | 11/2013 |
| CN | 102719062 | B | 1/2014 |
| CN | 102250450 | B | 4/2014 |
| CN | 102424716 | B | 4/2014 |
| CN | 102649870 | B | 5/2014 |
| CN | 103772918 | A | 5/2014 |
| CN | 102690505 | B | 6/2014 |
| CN | 102807744 | B | 6/2014 |
| CN | 102911485 | B | 6/2014 |
| CN | 102775744 | A | 7/2014 |
| CN | 101928447 | B | 8/2014 |
| CN | 102933656 | B | 10/2014 |
| CN | 103173888 | B | 2/2015 |
| CN | 103232686 | B | 3/2015 |
| CN | 102850733 | B | 5/2015 |
| CN | 103044868 | B | 5/2015 |
| CN | 103102656 | B | 8/2015 |
| CN | 104059340 | B | 11/2015 |
| CN | 103613914 | B | 1/2016 |
| CN | 103342880 | B | 3/2016 |
| CN | 103408905 | B | 3/2016 |
| CN | 104177791 | B | 3/2016 |
| CN | 103467934 | B | 4/2016 |
| CN | 104140649 | B | 5/2016 |
| CN | 103374210 | B | 6/2016 |
| CN | 104448734 | B | 6/2016 |
| CN | 103160080 | B | 8/2016 |
| CN | 104327467 | B | 8/2016 |
| CN | 105219039 | B | 8/2016 |
| CN | 105385118 | B | 11/2016 |
| CN | 104231575 | B | 1/2017 |
| CN | 104962048 | B | 4/2017 |
| CN | 105086391 | B | 4/2017 |
| CN | 105219040 | A | 5/2017 |
| CN | 102532816 | B | 7/2017 |
| CN | 105623204 | B | 11/2017 |
| CN | 105377983 | B | 12/2017 |
| CN | 104812838 | B | 3/2018 |
| CN | 105400179 | B | 5/2018 |
| CN | 106147156 | B | 1/2019 |
| CN | 106700440 | B | 2/2019 |
| CN | 104845297 | B | 6/2019 |
| CN | 109957222 | A | 7/2019 |
| CN | 107418156 | B | 12/2019 |
| CN | 106280320 | A | 11/2020 |
| CN | 107227002 | B | 4/2021 |
| CN | 109467891 | B | 4/2021 |
| CN | 110121525 | B | 4/2021 |
| CN | 108329662 | B | 5/2021 |
| CN | 109467890 | B | 7/2021 |
| CN | 110105724 | B | 9/2021 |
| CN | 110499007 | B | 10/2021 |
| CN | 114085495 | A | 10/2021 |
| CN | 113736221 | A | 12/2021 |
| CN | 109867922 | B | 1/2022 |
| CN | 111621125 | B | 2/2022 |
| CN | 112745642 | B | 3/2022 |
| CN | 111662538 | B | 4/2022 |
| CN | 112574535 | B | 4/2022 |
| CN | 112745641 | B | 4/2022 |
| CN | 114410075 | A | 4/2022 |
| CN | 114426760 | A | 5/2022 |
| CN | 114426763 | A | 5/2022 |
| CN | 114479374 | A | 5/2022 |
| CN | 114517004 | A | 5/2022 |
| CN | 114656760 | A | 6/2022 |
| CN | 112745640 | B | 7/2022 |
| CN | 112795147 | B | 7/2022 |
| CN | 114702791 | A | 7/2022 |
| CN | 114752188 | A | 7/2022 |
| CN | 114773798 | A | 7/2022 |
| CN | 112143181 | B | 8/2022 |
| CN | 112778710 | B | 8/2022 |
| CN | 114891326 | A | 8/2022 |
| CN | 112724618 | B | 9/2022 |
| CN | 112321995 | B | 11/2022 |
| CN | 115304895 | A | 11/2022 |
| CN | 102391624 | B | 1/2023 |
| CN | 115612261 | A | 1/2023 |
| CN | 112236478 | B | 3/2023 |
| CN | 112771115 | B | 3/2023 |
| CN | 113136093 | B | 3/2023 |
| CN | 113462129 | B | 3/2023 |
| CN | 115785627 | A | 3/2023 |
| CN | 113667283 | B | 4/2023 |
| CN | 113817298 | B | 4/2023 |
| CN | 113912993 | B | 4/2023 |
| CN | 113956621 | B | 4/2023 |
| CN | 116023769 | A | 4/2023 |
| CN | 116589833 | A | 4/2023 |
| CN | 111808405 | B | 5/2023 |
| CN | 114163783 | B | 5/2023 |
| CN | 116218154 | A | 6/2023 |
| CN | 116285235 | A | 6/2023 |
| CN | 116285237 | A | 6/2023 |
| CN | 116285248 | A | 6/2023 |
| CN | 116355367 | A | 6/2023 |
| CN | 114015205 | B | 8/2023 |
| CN | 114106521 | B | 8/2023 |
| CN | 114174426 | B | 8/2023 |
| CN | 114174427 | B | 8/2023 |
| CN | 114539732 | B | 8/2023 |
| CN | 115197551 | B | 8/2023 |
| CN | 115232449 | B | 8/2023 |
| CN | 116515258 | A | 8/2023 |
| CN | 116606533 | A | 8/2023 |
| CN | 114634688 | B | 9/2023 |
| CN | 116675962 | A | 9/2023 |
| CN | 116731483 | A | 9/2023 |
| CN | 116814050 | A | 9/2023 |
| CN | 114426759 | B | 10/2023 |
| CN | 115505243 | B | 10/2023 |
| CN | 114106527 | B | 11/2023 |

(56) References Cited

FOREIGN PATENT DOCUMENTS

| | | | | |
|---|---|---|---|---|
| CN | 114456550 | B | | 11/2023 |
| CN | 114702792 | B | | 11/2023 |
| CN | 114641535 | B | | 12/2023 |
| CN | 117229610 | A | | 12/2023 |
| CN | 117304660 | A | | 12/2023 |
| CN | 113105727 | B | | 1/2024 |
| CN | 117343495 | A | | 1/2024 |
| CN | 117343496 | A | | 1/2024 |
| CN | 117362941 | A | | 1/2024 |
| CN | 117384471 | A | | 1/2024 |
| CN | 117447818 | A | | 1/2024 |
| CN | 117487326 | A | | 2/2024 |
| CN | 117487327 | A | | 2/2024 |
| CN | 117487329 | A | | 2/2024 |
| CN | 117511142 | A | | 2/2024 |
| CN | 115651375 | A | | 3/2024 |
| CN | 115926390 | A | | 3/2024 |
| EP | 4242558 | A1 | | 9/2023 |
| JP | 5059706 | B2 | | 10/2012 |
| JP | 5295490 | B2 | | 9/2013 |
| JP | 5315683 | B2 | | 10/2013 |
| JP | 5369766 | B2 | | 12/2013 |
| JP | 5387016 | B2 | | 1/2014 |
| JP | 5425403 | B2 | | 2/2014 |
| JP | 5492082 | B2 | | 5/2014 |
| JP | 5538198 | B2 | | 7/2014 |
| JP | 5422764 | B2 | | 9/2014 |
| JP | 5720778 | B2 | | 5/2015 |
| JP | 6177252 | B2 | | 8/2017 |
| JP | 6337660 | B2 | | 6/2018 |
| JP | 6426985 | B2 | | 11/2018 |
| JP | 6456291 | B2 | | 1/2019 |
| JP | 6506806 | B2 | | 4/2019 |
| JP | 6531647 | B2 | | 6/2019 |
| JP | 2020019919 | A | | 2/2020 |
| JP | 2020203963 | A | | 12/2020 |
| JP | 7054105 | B2 | | 4/2022 |
| JP | 7071236 | B2 | | 5/2022 |
| JP | 2022070452 | A | | 5/2022 |
| JP | 2022070453 | A | | 5/2022 |
| JP | 7182396 | B2 | | 12/2022 |
| JP | 7256822 | B2 | | 4/2023 |
| JP | 7340422 | B2 | | 5/2023 |
| JP | 2023068401 | A | | 5/2023 |
| JP | 7368976 | B2 | | 10/2023 |
| JP | 5412057 | B2 | | 2/2024 |
| KR | 100824781 | B1 | | 4/2008 |
| KR | 100846861 | B1 | | 7/2008 |
| KR | 100978777 | B1 | | 8/2010 |
| KR | 101207183 | B1 | | 11/2012 |
| KR | 101558874 | B1 | | 10/2015 |
| KR | 20160107960 | A | | 9/2016 |
| KR | 101748243 | B1 | | 9/2017 |
| KR | 102191386 | B1 | | 12/2020 |
| KR | 102293828 | B1 | | 8/2021 |
| TW | 1640572 | B | * | 11/2018 |
| WO | WO 2018/187026 | A1 | | 10/2018 |
| WO | WO 2021/140246 | A1 | | 7/2021 |
| WO | WO 2021/257749 | A2 | | 12/2021 |

OTHER PUBLICATIONS

International Search Report and Written Opinion for PCT/US2022/052535 dated Mar. 31, 2023, 14 pages.

Supplementary European Search Report for EP 22 90 8279 dated Oct. 23, 2025, 10 pages.

* cited by examiner

HEAT STABILIZED, FLAME RETARDANT POLYMER COMPOSITION

RELATED APPLICATIONS

The present application is based upon and claims priority to U.S. Provisional Patent Application Ser. No. 63/288,954, having a filing date of Dec. 13, 2021; U.S. Provisional Patent Application Ser. No. 63/388,730, having a filing date of Jul. 13, 2022; U.S. Provisional Patent Application Ser. No. 63/388,733, having a filing date of Jul. 13, 2022; U.S. Provisional Patent Application Ser. No. 63/417,543, having a filing date of Oct. 19, 2022; and U.S. Provisional Patent Application Ser. No. 63/417,522, having a filing date of Oct. 19, 2022, all of which are incorporated herein by reference.

BACKGROUND OF THE INVENTION

Electric vehicles, such as battery-electric vehicles, plug-in hybrid-electric vehicles, mild hybrid-electric vehicles, or full hybrid-electric vehicles generally have an electric powertrain that contains an electric propulsion source (e.g., battery) and a transmission. The propulsion source provides a high voltage electrical current that is supplied to the transmission via one or more power electronics modules. Due to their small size and complex geometry, attempts have been made at forming various electric vehicle parts from polyamide compositions. Unfortunately, however, most polyamide compositions, especially when reinforced with glass fibers, lack sufficient ignition resistance and thus often require the use of one or more external flame retardants (e.g., halogenated compounds). Nevertheless, the presence of halogens is not desired in most electrical applications due to environmental concerns when the composition is burned. While halogen-free flame retardants have been developed, the use of such materials in polyamide resins is typically associated with a corresponding adverse impact on the mechanical and/or electrical properties of the composition, particularly at the higher temperatures often encountered in an electric vehicle. As such, a need currently exists for a polyamide-containing composition for use in electric vehicles, which can remain flame retardant and also possess good mechanical and/or electrical properties.

SUMMARY OF THE INVENTION

In accordance with one embodiment of the present invention, a polymer composition is disclosed that comprises from about 20 wt. % to about 70 wt. % of a polymer matrix that includes a polyimide; from about 10 wt. % to about 50 wt. % of inorganic fibers; from about 5 wt. % to about 30 wt. % of a flame retardant system that includes an organophosphorous compound; and from about 0.1 wt. % to about 5 wt. % of a stabilizer system that includes a heat stabilizer, wherein the heat stabilizer includes a copper compound. The polymer composition exhibits an initial tensile strength and an aged tensile strength after exposure to temperature of 200° C. for 1,000 hours. The ratio of the aged tensile strength to the initial tensile strength is about 0.5 or more, wherein the initial tensile strength and the aged tensile strength are determined at a temperature of about 23° C. in accordance with ISO 527:2019.

Other features and aspects of the present invention are set forth in greater detail below.

BRIEF DESCRIPTION OF THE FICIURES

A full and enabling disclosure of the present invention, including the best mode thereof to one skilled in the art, is set forth more particularly in the remainder of the specification, including reference to the accompanying figures, in which.

DETAILED DESCRIPTION

Figure 1:
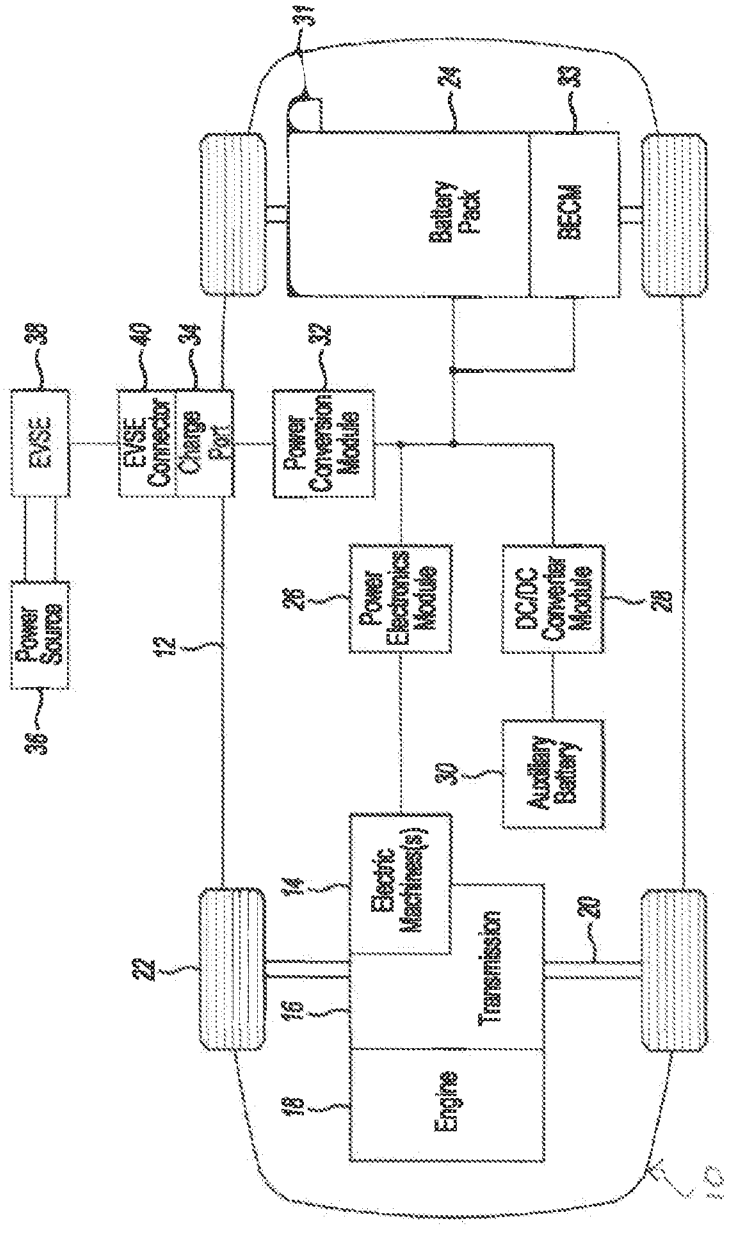
FIG. 1 is a schematic illustration of one embodiment of an electric vehicle that may employ a high voltage connector.

It is to be understood by one of ordinary skill in the art that the present discussion is a description of exemplary embodiments only, and is not intended as limiting the broader aspects of the present invention.

Generally speaking, the present invention is directed to a polymer composition that has a unique combination of properties that enables it to be readily employed in an electric vehicle, such as a battery-powered electric vehicle, fuel cell-powered electric vehicle, plug-in hybrid-electric vehicle (PHEV), mild hybrid-electric vehicle (MHEV), full hybrid-electric vehicle (FHEV), etc. Notably, the polymer composition contains a polymer matrix that includes a polyamide, inorganic fibers, a flame retardant system that includes an organophosphorous compound, and a stabilizer system that includes a copper-containing heat stabilizer. Through selective control over the nature of these and relative concentration of these components, the present inventors have discovered that the resulting polymer composition can achieve a unique combination of flame retardancy, insulative properties, and good mechanical properties even at relatively small thickness values, such as about 4 millimeters or less, in some embodiments about from about 0.2 to about 3.2 millimeters, in some embodiments from about 0.4 to about 2.5 millimeters, and in some embodiments, from about 0.8 to about 2 millimeters. The flame retardant properties of the composition may be characterized in accordance the procedure of Underwriter's Laboratory Bulletin 94 entitled "Tests for Flammability of Plastic Materials, UL94." Several ratings can be applied based on the time to extinguish ((total flame time of a set of 5 specimens) and ability to resist dripping as described in more detail below. According to this procedure, for example, the composition may exhibit a V0 rating at a part thickness such as noted above (e.g., from about 0.4 to about 3.2 millimeters, e.g., 0.4, 0.8, or 1.6 millimeters), which means that it has a total flame time of about 50 seconds or less. To achieve a V0 rating, the composition may also exhibit a total number of drips of burning particles that ignite cotton of 0.

Conventionally, it was believed that compositions having flame retardant properties could not achieve the high degree of mechanical properties required for use in an electric vehicle. The present inventors have discovered, however, that the composition of the present invention can still achieve good mechanical properties. For example, the polymer composition may exhibit a Charpy notched impact strength of about 5 $kJ/m^2$ or more, in some embodiments about 6 $kJ/m^2$ or more, in some embodiments from about 7 to about 30 $kJ/m^2$, and in some embodiments, from about 8 to about 25 $kJ/m^2$, measured at 23° C. according to ISO 179-1:2010. The composition may also exhibit a tensile strength of about 50 Megapascals ("MPa") or more, in some embodiments about 80 MPa or more, in some embodiments from about 100 to about 200 MPa, and in some embodiments, from about 110 to about 180 MPa; tensile modulus of about 6,000 MPa or more, in some embodiments from about 7,500 MPa to about 20,000 MPa, and in some embodiments, from about 9,000 to about 15,000 MPa; and/or tensile elongation at break of from about 0.5% to about 5%, in some embodiments from about 0.8% to about 4%, and in some embodiments, from about 1% to about 3.5%, as determined in accordance with ISO 527:2019 at a temperature of about 23° C. The composition may also exhibit a flexural strength of from about 70 to about 500 MPa, in some embodiments from about 80 to about 400 MPa, and in some embodiments, from about 90 to about 300 MPa and/or a flexural modulus of from about 10,000 MPa to about 30,000 MPa, in some embodiments from about 12,000 MPa to about 25,000 MPa, and in some embodiments, from about 14,000 MPa to about 20,000 MPa, as determined in accordance with ISO 178:2019 at a temperature of about 23° C.

Notably, the present inventors have also discovered that the polymer composition is not highly sensitive to high temperatures. For example, the polymer composition may be placed into contact with an atmosphere having a temperature of about 100° C. or more, in some embodiments from about 120° C. to about 250° C., and in some embodiments, from about 140° C. to about 200° C. (e.g., 140° C., 150° C., or 200° C.). Even at such high temperatures, the mechanical properties (e.g., impact strength, tensile properties, etc.) may remain within the ranges noted above. The mechanical properties can also remain stable at such temperatures for a substantial period of time, such as for about 100 hours or more, in some embodiments from about 200 hours to about 3,000 hours, and in some embodiments, from about 250 hours to about 2,000 hours (e.g., 250, 500, 1,000, 1,500, or 2,000 hours).

After "aging" at 200° C. for 1,000 hours, for example, the ratio of the aged tensile strength to the initial tensile strength prior to such aging may be about 0.5 or more, in some embodiments about 0.6 or more, in some embodiments about 0.65 or more, and in some embodiments, from about 0.7 to 1.0; the ratio of the aged tensile elongation to the initial tensile elongation prior to such aging may be about 0.3 or more, in some embodiments about 0.35 or more, and in some embodiments, from about 0.4 to 0.9; and/or the ratio of the aged tensile modulus to the initial tensile modulus prior to such aging may be about 0.7 or more, in some embodiments about 0.8 or more, and in some embodiments, from about 0.9 to 1.2. The tensile strength after aging at 200° C. for 1,000 hours may, for instance, be about 50 MPa or more, in some embodiments about 60 MPa or more, in some embodiments from about 70 to about 180 MPa, and in some embodiments, from about 80 to about 150 MPa, as determined at a temperature of about 23° C. in accordance with ISO 527:2019. After "aging" at 200° C. for 1,000 hours, the ratio of the aged Charpy notched impact strength to the initial impact strength prior to such aging may also be about 0.5 or more, in some embodiments about 0.6 or more, and in some embodiments, from about 0.7 to 1.0. For example, the Charpy notched impact strength after aging at 200° C. for 1,000 hours may be about 5 $kJ/m^2$ or more, in some embodiments about 6 $kJ/m^2$ or more, in some embodiments from about 7 to about 30 $kJ/m^2$, and in some embodiments, from about 8 to about 25 $kJ/m^2$, as determined at a temperature of about 23° C. in accordance with ISO 179-1:2010.

The insulative properties of the polymer composition may be characterized by a high comparative tracking index ("CTI"), such as about 550 volts or more, in some embodiments about 580 volts or more, and in some embodiments, about 600 volts or more, as determined in accordance with IEC 60112:2003 at a part thickness such as noted above (e.g., 3 millimeters). The polymer composition may also be relatively resistant to the release of acids in a moist environment, which can minimize corrosion. More particularly, 72 hours after formation of an aqueous dispersion containing 70 wt. % of a deionized water phase and 30 wt. % of the polymer composition, the pH value of the deionized water phase has a pH value that is relatively close to neutral, such as from about 4 to about 8, in some embodiments from about 4 to about 7.5, and in some embodiments, from about 5 to about 7.

Various embodiments of the present invention will now be described in more detail.

I. Polymer Composition

A. Polymer Matrix

As indicated above, the polymer matrix typically constitutes from about 20 wt. % to about 70 wt. %, in some embodiments from about 30 wt. % to about 65 wt. %, and in some embodiments, from about 40 wt. % to about 60 wt. % of the polymer composition. The polymer matrix contains at least one polyamide. For example, polyamides typically constitute from about 50 wt. % to 100 wt. %, in some embodiments from about 70 wt. % to 100 wt. %, and in some embodiments, from about 90 wt. % to 100 wt. % of the polymer matrix (e.g., 100 wt. %).

Polyamides generally have a CO—NH linkage in the main chain and are obtained by condensation of a diamine and a dicarboxylic acid, by ring opening polymerization of lactam, or self-condensation of an amino carboxylic acid. For example, the polyamide may contain aliphatic repeating units derived from an aliphatic diamine, which typically has from 4 to 14 carbon atoms. Examples of such diamines include linear aliphatic alkylenediamines, such as 1,4-tetramethylenediamine, 1,6-hexanediamine, 1,7-heptanediamine, 1,8-octanediamine, 1,9-nonanediamine, 1,10-decanediamine, 1,11-undecanediamine, 1,12-dodecanediamine, etc.; branched aliphatic alkylenediamines, such as 2-methyl-1,5-pentanediamine, 3-methyl-1,5 pentanediamine, 2,2,4-trimethyl-1,6-hexanediamine, 2,4,4-trimethyl-1,6-hexanediamine, 2,4-dimethyl-1,6-hexanediamine, 2-methyl-1,8-octanediamine, 5-methyl-1,9-nonanediamine, etc.; as well as combinations thereof. Of course, aromatic and/or alicyclic diamines may also be employed. Furthermore, examples of the dicarboxylic acid component may include aromatic dicarboxylic acids (e.g., terephthalic acid, isophthalic acid, 2,6-naphthalenedicarboxylic acid, 2,7-naphthalenedicarboxylic acid, 1,4-naphthalenedicarboxylic acid, 1,4-phenylenedioxy-diacetic acid, 1,3-phenylenedioxy-diacetic acid, diphenic acid, 4,4'-oxydibenzoic acid, diphenylmethane-4,4'-dicarboxylic acid, diphenylsulfone-4,4'-dicarboxylic acid, 4,4'-biphenyldicarboxylic acid, etc.), aliphatic dicarboxylic acids (e.g., adipic acid, sebacic acid, etc.), and so forth. Examples of lactams include pyrrolidone, aminocaproic acid, caprolactam, undecanlactam, lauryl lactam, and so forth. Likewise, examples of amino carboxylic acids include amino fatty acids, which are compounds of the aforementioned lactams that have been ring opened by water.

In certain embodiments, an "aliphatic" polyamide is employed that is formed only from aliphatic monomer units (e.g., diamine and dicarboxylic acid monomer units). Particular examples of such aliphatic polyamides include, for instance, nylon-4 (poly-α-pyrrolidone), nylon-6 (polycaproamide), nylon-11 (polyundecanamide), nylon-12 (polydodecanamide), nylon-46 (polytetramethylene adipamide), nylon-66 (polyhexamethylene adipamide), nylon-610, and nylon-612. Nylon-6 and nylon-66 are particularly suitable. In one particular embodiment, for example, nylon-6 or nylon-66 may be used alone. In other embodiments, blends of nylon-6 and nylon-66 may be employed. When such a blend is employed, the weight ratio of nylon-66 to nylon-6 is typically from about 1 to about 3, in some embodiments from about 1.1 to about 2.5, and in some embodiments, from about 1.2 to about 2. Alternatively, the weight ratio of nylon-6 to nylon-66 may also be from about 1 to about 3, in some embodiments from about 1.1 to about 2.5, and in some embodiments, from about 1.2 to about 2.

Of course, it is also possible to include aromatic monomer units in the polyamide such that it is considered semi-aromatic (contains both aliphatic and aromatic monomer units) or wholly aromatic (contains only aromatic monomer units). For instance, suitable semi-aromatic polyamides may include poly(nonamethylene terephthalamide) (PA9T), poly (nonamethylene terephthalamide/nonamethylene decanediamide) (PA9T/910), poly(nonamethylene terephthalamide/ nonamethylene dodecanediamide) (PA9T/912), poly (nonamethylene terephthalamide/11-aminoundecanamide) (PA9T/11), poly(nonamethylene terephthalamide/12-aminododecanamide) (PA9T/12), poly(decamethylene terephthalamide/11-aminoundecanamide) (PA10T/11), poly(decamethylene terephthalamide/12-aminododecanamide) (PA10T/12), poly(decamethylene terephthalamide/decamethylene decanediamide) (PA10T/1010), poly(decamethylene terephthalamide/decamethylene dodecanediamide) (PA10T/1012), poly(decamethylene terephlhalamide/tetramethylene hexanediamide) (PA10T/46), poly(decamethylene terephthalamide/caprolactam) (PA10T/6), poly(decamethylene terephthalamide/hexamethylene hexanediamide) (PA10T/66), poly(dodecamethylene lerephthalamide/dodecamelhylene dodecanediarnide) (PA12T/1212), poly(dodecamethylene terephthalamide/caprolactam) (PA12T/6), poly(dodecamethylene terephthalamide/hexamethylene hexanediamide) (PA12T/66), and so forth.

The polyamide(s) employed in the polymer composition may be crystalline or semi-crystalline in nature and thus have a measurable melting temperature. The melting temperature may be relatively high such that the composition can provide a substantial degree of heat resistance to a resulting part. For example, the polyamide(s) may have a melting temperature of about 220° C. or more, in some embodiments from about 240° C. to about 325° C., and in some embodiments, from about 250° C. to about 335° C. The polyamide(s) may also have a relatively high glass transition temperature, such as about 30° C. or more, in some embodiments about 40° C. or more, and in some embodiments, from about 45° C. to about 140° C. The glass transition and melting temperatures may be determined as is well known in the art using differential scanning calorimetry ("DSC"), such as determined by ISO 11357-2:2020 (glass transition) and 11357-3:2018 (melting).

B. Inorganic Fibers

Inorganic fibers typically constitute from about 10 wt. % to about 50 wt. %, in some embodiments from about 15 wt. % to about 45 wt. %, and in some embodiments, from about 20 wt. % to about 40 wt. % of the composition. The inorganic fibers typically have a high degree of tensile strength relative to their mass. For example, the ultimate tensile strength of the fibers (determined in accordance with ASTM D822/D822M-13 (2018)) is typically from about 1,000 to about 15,000 Megapascals ("MPa"), in some embodiments from about 2,000 MPa to about 10,000 MPa, and in some embodiments, from about 3,000 MPa to about 6,000 MPa. To help maintain the desired dielectric properties, the inorganic fibers may be formed from materials that are generally insulative in nature, such as glass, ceramics (e.g., alumina or silica), etc. Glass fibers are particularly suitable, such as E-glass, A-glass, C-glass, D-glass, AR-glass, R-glass, 51-glass, S2-glass, etc.

Further, although the fibers may have a variety of different sizes, fibers having a certain size can help improve the mechanical properties of the resulting polymer composition. The inorganic fibers may, for example, have a nominal diameter of about 5 micrometers or more, in some embodiments about 6 micrometers or more, in some embodiments from about 8 micrometers to about 40 micrometers, and in some embodiments from about 9 micrometers to about 20 micrometers. The fibers (after compounding) may also have a relatively high aspect ratio (average length divided by nominal diameter), such as about 2 or more, in some embodiments about 4 or more, in some embodiments from about 5 to about 50, and in some embodiments, from about 8 to about 40 are particularly beneficial. Such fibers may, for instance, have a volume average length (after compounding) of about 10 micrometers or more, in some embodiments about 25 micrometers or more, in some embodiments from about 50 micrometers or more to about 800 micrometers or less, and in some embodiments from about 60 micrometers to about 500 micrometers.

C. Flame Retardant System

In addition to the components above, the polymer composition also contains a flame retardant system that is capable of achieving the desired flammability performance, insulative properties, and mechanical properties. The flame retardant system typically constitutes from about 5 wt. % to about 30 wt. %, in some embodiments from about 8 wt. % to about 25 wt. %, and in some embodiments, from about 10 wt. % to about 20 wt. % of the polymer composition. The flame retardant system generally includes at least one organophosphorous flame retardant. The halogen (e.g., bromine, chlorine, and/or fluorine) content of such a flame retardant is typically about 1,500 parts per million by weight ("ppm") or less, in some embodiments about 900 ppm or less, and in some embodiments, about 50 ppm or less. In certain embodiments, the flame retardants are complete free of halogens (i.e., 0 ppm). Organophosphorous flame retardants typically constitute from about 40 wt. % to 100 wt. %, in some embodiments from about 50 wt. % to about 95 wt. %, and in some embodiments, from about 60 wt. % to about 90 wt. % of the flame retardant system. In certain embodiments, for instance, organophosphorous flame retardants may constitute from about 1 wt. % to about 25 wt. %, in some embodiments from about 5 wt. % to about 20 wt. %, and in some embodiments, from about 10 wt. % to about 15 wt. % of the entire polymer composition.

One particularly suitable organophosphorous flame retardant may be a phosphinate, which can enhance the flame retardancy of the overall composition, particularly for relatively thin parts, without adversely impacting mechanical and insulative properties. Such phosphinates are typically salts of a phosphinic acid and/or diphosphinic acid, such as those having the general formula (I) and/or formula (II):

(I)

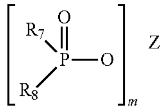

(II)

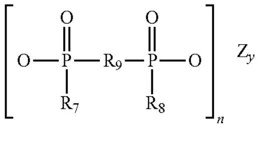

wherein, $R_7$ and $R_8$ are, independently, hydrogen or substituted or unsubstituted, straight chain, branched, or cyclic hydrocarbon groups (e.g., alkyl, alkenyl, alkylnyl, aralkyl, aryl, alkaryl, etc.) having 1 to 6 carbon atoms, particularly alkyl groups having 1 to 4 carbon atoms, such as methyl, ethyl, n-propyl, iso-propyl, n-butyl, or tert-butyl groups;

$R_9$ is a substituted or unsubstituted, straight chain, branched, or cyclic $C_1$-$C_{10}$ alkylene, arylene, arylalkylene, or alkylarylene group, such as a methylene, ethylene, n-propylene, iso-propylene, n-butylene, tert-butylene, n-pentylene, n-octylene, n-dodecylene, phenylene, naphthylene, methylphenylene, ethylphenylene, tert-butylphenylene, methylnaphthylene, ethylnaphthylene, t-butylnaphthylene, phenylethylene, phenylpropylene or phenylbutylene group;

Z is Mg, Ca, Al, Sb, Sn, Ge, Ti, Zn, Fe, Zr, Ce, Bi, Sr, Mn, Li, Na, K, and/or a protonated nitrogen base;

y is from 1 to 4, and preferably 1 to 2 (e.g., 1);

n is from 1 to 4, and preferably 1 to 2 (e.g. 1); and m is from 1 to 4 and preferably 1 to 2 (e.g., 2).

The phosphinates may be prepared using any known technique, such as by reacting a phosphinic acid with a metal carbonate, metal hydroxide, or metal oxides in aqueous solution. Particularly suitable phosphinates include, for example, metal salts of dimethylphosphinic acid, ethylmethylphosphinic acid, diethylphosphinic acid, methyl-n-propylphosphinic acid, methane-di(methylphosphinic acid), ethane-1,2-di(methylphosphinic acid), hexane-1,6-di(methylphosphinic acid), benzene-1,4-di(methylphosphinic acid), methylphenylphosphinic acid, diphenylphosphinic acid, hypophosphoric acid, etc. The resulting salts are typically monomeric compounds; however, polymeric phosphinates may also be formed. Particularly suitable metals for the salts may include Al and Zn. For instance, one particularly suitable phosphinate is zinc diethylphosphinate. Another particularly suitable phosphinate is aluminum diethylphosphinate, such as commercially available from Clariant under the name DEPAL™.

Of course, other organophosphorous flame retardants may also be employed in the flame retardant system. For example, in one embodiment, mono- and oligomeric phosphoric and phosphonic esters may be employed, such as tributyl phosphate, triphenyl phosphate, tricresyl phosphate, diphenyl cresyl phosphate, diphenyl octyl phosphate, diphenyl 2-ethylcresyl phosphate, tri(isopropylphenyl)phosphate, resorcinol-bridged oligophosphate, bisphenol A phosphates (e.g., bisphenol A-bridged oligophosphate or bisphenol A bis(diphenyl phosphate)), etc., as well as mixtures thereof. Aryl phosphates, aryl phosphonites, aryl phosphonates, hypophosphorous acid salts, etc.; phosphazenes; red phosphorous; etc., may also be employed as suitable organophorphorous flame retardants.

Besides organophosphorous flame retardants, the flame retardant system may also contain a variety of other components. For example, in certain embodiments, the flame retardant system may include one or more organophosphorous synergists. The halogen (e.g., bromine, chlorine, and/or fluorine) content of such a synergist is typically about 1,500 parts per million by weight ("ppm") or less, in some embodiments about 900 ppm or less, and in some embodiments, about 50 ppm or less. In certain embodiments, the synergists are complete free of halogens (i.e., 0 ppm). When employed, such organophosphorous synergists typically constitute from about 5 wt. % to about 50 wt. %, in some embodiments from about 15 wt. % to about 45 wt. %, and in some embodiments, from about 20 wt. % to about 40 wt. % of the flame retardant system. In certain embodiments, for instance, organophosphorous synergists may constitute from about 0.1 wt. % to about 20 wt. %, in some embodiments from about 0.5 wt. % to about 15 wt. %, and in some embodiments, from about 1 wt. % to about 10 wt. % of the entire polymer composition. Examples of suitable organophosphorus synergists may include, for instance, salts of phosphorous acid, such as phosphates, hydrogen phosphates, orthophosphates, pyrophosphates, phosphonites, phosphites, phosphonates, etc., as well as combination thereof.

The cation used to form the salts of phosphorous acid may be a metal cation (e.g., Mg, Ca, Al, Sb, Sn, Ge, Ti, Zn, Fe, Zr, Ce, Bi, Sr, Mn, Li, Na, K, etc., as well as combinations thereof); protonated nitrogen base(s), or combinations of any of the foregoing (e.g., combination of a metal and protonated nitrogen base). When employing a metal cation, aluminum and zinc are particularly suitable, such as aluminum phosphite, zinc phosphite, aluminum phosphonate, zinc phoshonate, calcium phosphate, aluminum phosphate, zinc phosphate, titanium phosphate, iron phosphate, calcium hydrogenphosphate, calcium hydrogenphosphate dihydrate, magnesium hydrogenphosphate, titanium hydrogenphosphate, zinc hydrogenphosphate, aluminum phosphate, aluminum orthophosphate, aluminum hydrogenphosphate, aluminum dihydrogenphosphate, magnesium dihydrogenphosphate, calcium dihydrogenphosphate, zinc dihydrogenphosphate, zinc dihydrogenphosphate dihydrate, aluminum dihydrogenphosphate, calcium pyrophosphate, calcium dihydrogenpyrophosphate, magnesium pyrophosphate, zinc pyrophosphate aluminum pyrophosphate, etc., as well as blends thereof. Suitable protonated nitrogen bases may likewise include those having a substituted or unsubstituted ring structure, along with at least one nitrogen heteroatom in the ring structure (e.g., heterocyclic or heteroaryl group) and/or at least one nitrogen-containing functional group (e.g., amino, acylamino, etc.) substituted at a carbon atom and/or a heteroatom of the ring structure. Examples of such heterocyclic groups may include, for instance, pyrrolidine, imidazoline, pyrazolidine, oxazolidine, isoxazolidine, thiazolidine, isothiazolidine, piperidine, piperazine, thiomorpholine, etc. Likewise, examples of heteroaryl groups may include, for instance, pyrrole, imidazole, pyrazole, oxazole, isoxazole, thiazole, isothiazole, triazole, furazan, oxadiazole, tetrazole, pyridine, diazine, oxazine, triazine, tetrazine, and so forth. If desired, the ring structure of the base may also be substituted with one or more functional groups, such as acyl, acyloxy, acylamino, alkoxy, alkenyl, alkyl, amino, aryl, aryloxy, carboxyl, carboxyl ester, cycloalkyl, hydroxyl, halo, haloalkyl, heteroaryl, heterocyclyl, etc. Substitution may occur at a heteroatom and/or a carbon atom of the ring structure. One suitable nitrogen base is melamine, which contains a 1,3,5 triazine ring structure substituted with an amino functional group at each of the three carbon atoms. Another suitable nitrogen base is piperazine, which is a six-membered ring structure containing two nitrogen atoms at opposite positions in the ring.

In one particular embodiment, the organophosphorous synergist may be a salt containing only a protonated nitrogen base cation, such as an azine (e.g., melamine and/or piperazine) phosphate salt. Examples of such azine phosphate salts may include, for instance, melamine orthophosphate, melamine pyrophosphate, melamine polyphosphate, piperazine orthophosphate, piperazine pyrophosphate, piperazine polyphosphate, etc., as well as blends thereof. Melamine polyphosphate may, for instance, be those commercially available from BASF under the name MELAPUR® (e.g., MELAPUR® 200 or 200/70). In another embodiment, the organophosphorous synergist may be a salt containing a combination of a metal cation and a protonated nitrogen base cation, such as an azine (e.g., melamine and/or piperazine) metal phosphate salt. Examples of suitable azine metal phosphate salts may include, for instance, melamine zinc phosphate, melamine magnesium phosphate, melamine calcium phosphate, bismelamine zincodiphosphate, bismelamine aluminotriphosphate, (melamine)$_2$Mg(HPO$_4$)$_2$, (melamine)$_2$Ca(HPO$_4$)$_2$, (melamine)$_3$Al(HPO$_4$)$_3$, (melamine)$_2$Mg (P$_2$O$_7$), (melamine)$_2$Ca(P$_2$O$_7$), (melamine)$_2$Zn(P$_2$O$_7$), (melamine)$_3$Al(P$_2$O$_7$)$_{3/2}$, etc., as well as blends thereof. Azine poly(metal phosphates) may also be employed that are known as hydrogenphosphato- or pyrophosphatometalates with complex anions having a tetra- or hexavalent metal atom as coordination site with bidentate hydrogenphosphate or pyrophosphate ligands. Examples of such poly(metal phosphates) may include, for instance, melamine poly(zinc phosphate) and/or melamine poly(magnesium phosphate).

The flame retardant system may be formed entirely of organophosphorous flame retardants and/or synergists, such as those described above. In certain embodiments, however, it may be desired to employ additional compounds to help increase the effectiveness of the system. For example, inorganic compounds may be employed as low halogen char-forming agents and/or smoke suppressants in combination with organophosphorous compound(s). Suitable inorganic compounds (anhydrous or hydrates) may include, for instance, inorganic molybdates, such as zinc molybdate (e.g., commercially available under the designation Kemgard® from Huber Engineered Materials), calcium molybdate, ammonium octamolybdate, zinc molybdate-magnesium silicate, etc. Other suitable inorganic compounds may include inorganic borates, such as zinc borate (commercially available under the designation Firebrake® from Rio Tento Minerals), etc.); basic zinc chromate (VI) (zinc yellow), zinc chromite, zinc permanganate, silica, magnesium silicate, calcium silicate, calcium carbonate, titanium dioxide, magnesium dihydroxide, and so forth. In particular embodiments, it may be desired to use an inorganic zinc compound, such as zinc molybdate, zinc borate, etc., to enhance the overall performance of the composition. When employed, such inorganic compounds (e.g., zinc borate) may, for example, constitute from about 1 wt. % to about 20 wt. %, in some embodiments from about 2 wt. % to about 15 wt. %, and in some embodiments, from about 3 wt. % to about 10 wt. % of the flame retardant system, and also from about 0.1 wt. % to about 10 wt. %, in some embodiments from about 0.2 wt. % to about 5 wt. %, and in some embodiments, from about 0.5 wt. % to about 4 wt. % of the entire polymer composition.

The flame retardant system and/or the polymer composition itself generally has a relatively low content of halogens (i.e., bromine, fluorine, and/or chlorine), such as about 15,000 parts per million ("ppm") or less, in some embodiments about 10,000 ppm or less, in some embodiments about 5,000 ppm or less, in some embodiments about 200 ppm or less, and in some embodiments, from about 1 ppm to about 1,500 ppm. Nevertheless, in certain embodiments of the present invention, halogen-based flame retardants may still be employed as an optional component. Particularly suitable halogen-based flame retardants are fluoropolymers, such as polytetrafluoroethylene (PTFE), fluorinated ethylene polypropylene (FEP) copolymers, perfluoroalkoxy (PFA) resins, polychlorotrifluoroethylene (PCTFE) copolymers, ethylene-chlorotrifluoroethylene (ECTFE) copolymers, ethylene-tetrafluoroethylene (ETFE) copolymers, polyvinylidene fluoride (PVDF), polyvinylfluoride (PVF), and copolymers and blends and other combination thereof. When employed, such halogen-based flame retardants typically constitute only about 10 wt. % or less, in some embodiments about 5 wt. % or less, and in some embodiments, about 1 wt. % or less of the flame retardant system. Likewise, the halogen-based flame retardants typically constitute about 5 wt. % or less, in some embodiments about 1 wt. % or less, and in some embodiments, about 0.5 wt. % or less of the entire polymer composition.

D. Stabilizer System

As noted above, the polymer composition also contains a stabilizer system, typically in an amount of from about 0.1 wt. % to about 5 wt. %, in some embodiments from about 0.2 wt. % to about 4 wt. %, and in some embodiments, from about 0.4 wt. % to about 3 wt. % of the composition. The stabilizer system generally includes at least one heat stabilizer that includes a copper compound. Such heat stabilizers typically constitute from about 30 wt. % to 100 wt. %, in some embodiments from about 40 wt. % to about 95 wt. %, and in some embodiments, from about 50 wt. % to about 90 wt. % of the stabilizer system. In certain embodiments, for instance, copper-containing heat stabilizers may constitute from about 0.01 wt. % to about 5 wt. %, in some embodiments from about 0.1 wt. % to about 1.5 wt. %, and in some embodiments, from about 0.3 wt. % to about 0.8 wt. % of the entire polymer composition. The resulting copper content of the polymer composition is also typically from about 1 ppm to about 1,000 ppm, in some embodiments from about 3 ppm to about 200 ppm, in some embodiments from about 5 ppm to about 150 ppm, and in some embodiments, from about 20 ppm to about 120 ppm.

The copper compound generally includes a copper(I) salt, copper(II) salt, copper complex, or a combination thereof. For example, the copper(I) salt may be CuI, CuBr, CuCI, CuCN, $CU_2O$, or a combination thereof and/or the copper (II) salt may be copper acetate, copper stearate, copper sulfate, copper propionate, copper butyrate, copper lactate, copper benzoate, copper nitrate, CuO, $CuCl_2$, or a combination thereof. In certain embodiments, the copper compound may be a copper complex that contains an organic ligand, such as alkyl phosphines, such as trialkylphosphines (e.g., tris-(n-butyl)phosphine) and/or dialkylphosphines (e.g., 2-bis-(dimethylphosphino)-ethane); aromatic phosphines, such as triarylphosphines (e.g., triphenylphosphine or substituted triphenylphosphine) and/or diarylphosphines (e.g., 1,6-(bis-(diphenylphosphino))-hexane, 1,5-bis-(diphenylphosphino)-pentane, bis-(diphenylphosphino)methane, 1,2-bis-(diphenylphosphino)ethane, 1,3-bis-(diphenylphosphino)propane, 1,4-bis-(diphenylphosphino)butane, etc.); mercaptobenzimidazoles; glycines; oxalates; pyridines (e.g., bypyridines); amines (e.g., ethylenediaminetetraacetates, diethylenetriamines, triethylenetetramines, etc.); acetylacetonates; and so forth, as well as combinations of the foregoing. Particularly suitable copper complexes for use in the heat stabilizer may include, for instance, copper acetylacetonate, copper oxalate, copper EDTA, $[Cu(PPh_3)_3X]$, $[Cu_2X(PPH_3)_3]$, $[Cu(PPh_3)X]$, $[Cu(PPh_3)_2X]$, $[CuX(PPh_3)$-2,2'-bypyridine], $[CuX(PPh_3)$-2,2'-biquinoline)], or a combination thereof, wherein $PPh_3$ is triphenylphosphine and X is CI, Br, I, CN, SCN, or 2-mercaptobenzimidazole. Other suitable complexes may likewise include 1,10-phenanthroline, o-phenylenebis(dimethylarsine), 1,2-bis(diphenylphosphino)-ethane, terpyridyl, and so forth.

When employed, the copper complexes may be formed by reaction of copper ions (e.g., copper(I) ions) with the organic ligand compound (e.g., triphenylphosphine or mercaptobenzimidazole compounds). For example, these complexes can be obtained by reacting triphenylphosphine with a copper(I) halide suspended in chloroform (G. Kosta, E. Reisenhofer and L. Stafani, J. lnorg. Nukl. Chem. 27 (1965) 2581). However, it is also possible to reductively react copper(II) compounds with triphenylphosphine to obtain the copper(I) addition compounds (F. U. Jardine, L. Rule, A. G. Vohrei, J. Chem. Soc. (A) 238-241 (1970)). However, the complexes used according to the invention can also be produced by any other suitable process. Suitable copper compounds for the preparation of these complexes are the copper(I) or copper (II) salts of the hydrogen halide acids, the hydrocyanic acid or the copper salts of the aliphatic carboxylic acids. Examples of suitable copper salts are copper (I) chloride, copper (I) bromide, copper (I) iodide, copper (I) cyanide, copper (II) chloride, copper (II) acetate, copper (II) stearate, etc., as well as combinations thereof. Copper(I)iodide and copper(I)cyanide are particularly suitable.

In addition to a copper compound, the heat stabilizer may also contain a halogen-containing synergist. When employed, the copper compound and halogen-containing synergist are typically used in quantities to provide a copper: halogen molar ratio of from about 1:1 to about 1:50, in some embodiments from about 1:4 to about 1:20, and in some embodiments, from about 1:6 to about 1:15. For example, the halogen content of the polymer composition may be from about 10 ppm to about 10,000 ppm, in some embodiments from about 50 ppm to about 5,000 ppm, in some embodiments from about 100 ppm to about 2,000 ppm, and in some embodiments, from about 300 ppm to about 1,500 ppm. The halogenated synergist generally includes an organic halogen-containing compound, such as aromatic and/or aliphatic halogen-containing phosphates, aromatic and/or aliphatic halogen-containing hydrocarbons; and so forth, as well as combinations thereof. For example, suitable halogen-containing aliphatic phosphates may include tris (halohydrocarbyl)-phosphates and/or phosphonate esters. Tris(bromohydrocarbyl) phosphates (brominated aliphatic phosphates) are particularly suitable. In particular, in these compounds, no hydrogen atoms are attached to an alkyl C atom which is in the alpha position to a C atom attached to a halogen. This minimizes the extent that a dehydrohalogenation reaction can occur which further enhances stability of the polymer composition. Specific exemplary compounds are tris(3-bromo-2,2-bis(bromomethyl)propyl)phosphate, tris(dibromoneopentyl)phosphate, tris(trichloroneopentyl) phosphate, tris(bromodichlorneopentyl)phosphate, tris (chlordibromoneopentyl)phosphate, tris(tribromoneopentyl) phosphate, or a combination thereof. Suitable halogen-containing aromatic hydrocarbons may include halogenated aromatic polymers (including oligomers), such as brominated styrene polymers (e.g., polydibromostyrene, polytribromostyrene, etc.); halogenated aromatic monomers, such as brominated phenols (e.g., tetrabromobisphenol-A); and so forth, as well as combinations thereof.

The stabilizer system may be formed entirely of copper-containing heat stabilizers. In certain embodiments, however, it may be desired to employ additional compounds to help increase the effectiveness of the system. For example, the stabilizer may include a hindered amine light stabilizer. When employed, such light stabilizers typically constitute from about 1 wt. % to 30 wt. %, in some embodiments from about 2 wt. % to about 25 wt. %, and in some embodiments, from about 5 wt. % to about 20 wt. % of the stabilizer system. In certain embodiments, for instance, hindered amine light stabilizers may constitute from about 0.001 wt. % to about 1 wt. %, in some embodiments from about 0.01 wt. % to about 0.5 wt. %, and in some embodiments, from about 0.05 wt. % to about 0.3 wt. % of the entire polymer composition. When employed, the weight ratio of the heat stabilizer(s) to the hindered amine light stabilizer(s) may be selectively controlled to achieve the desired properties, such as within a range of from about 2 to about 10, in some embodiments from about 2.5 to about 8, and in some embodiments, from about 3 to about 7.

The hindered amine light stabilizer may, for example, contain one or more compounds of the following general structures:

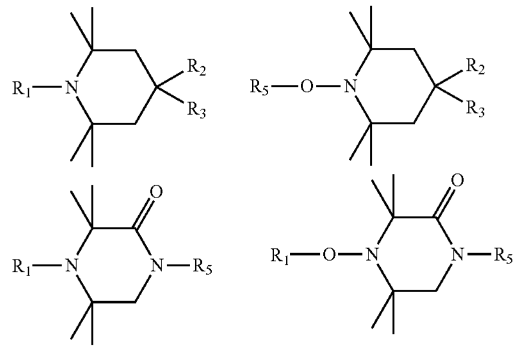

wherein, $R_2$, $R_3$, and $R_5$ are independently hydrogen, ether groups, ester groups, amine groups, amide groups, alkyl groups, alkenyl groups, alkynyl groups, aralkyl groups, cycloalkyl groups and aryl groups, in which the substituents in turn may contain functional groups; examples of functional groups are alcohols, ketones, anhydrides, imines, siloxanes, ethers, carboxyl groups, aldehydes, esters, amides, imides, amines, nitriles, ethers, urethanes, or any combination thereof.

In certain embodiments, the hindered amine light stabilizer includes a substituted piperidine compound, such as an alkyl-substituted piperidyl, piperidinyl or piperazinone compound, and substituted alkoxypiperidinyl compounds. Examples of such compounds may include, for instance, N,N'-bis(2,2,6,6-tetramethyl-4-piperdiyl)-1,3-benzenedicarboxamide (Nylostab® S-EED); 2,2,6,6-tetramethyl-4-piperidone; 2,2,6,6-tetramethyl-4-piperidinol; bis-(1,2,2,6,6-pentamethyl piperidyl)-(3',5'-di-tert-butyl-4'-hydroxybenzyl) butylmalonate; di-(2,2,6,6-tetramethyl-4-piperidyl) sebacate (Tinuvin® 770); oligomer of N-(2-hydroxyethyl)-2,2,6,6-tetramethyl-4-piperidinol and succinic acid (Tinuvin® 622); oligomer of cyanuric acid and N,N-di(2,2,6,6-tetramethyl-4-piperidyl)-hexamethylene diamine; bis-(2,2,6,6-tetramethyl-4-piperidinyl) succinate; bis-(1-octyloxy-2,2,6,6-tetramethyl-4-piperidinyl) sebacate (Tinuvin® 123); bis-(1,2,2,6,6-pentamethyl-4-piperidinyl) sebacate (Tinuvin® 765); tetrakis-(2,2,6,6-tetramethyl-4-piperidyl)-1,2,3,4-butane tetracarboxylate; N,N'-bis-(2,2,6,6-tetramethyl-4-piperidyl)-hexane-1,6-diamine (Chimasorb® T5); N-butyl-2,2,6,6-tetramethyl-4-piperidinarine; 2,2'-[(2, 2,6,6-tetramethyl-piperidinyl)-imino]-bis-[ethanol]; poly ((6-morpholine-5-triazine-2,4-diyl)(2,2,6,6-tetramethyl-4-piperidinyl)-iminohexarethylene-(2,2,6,6-tetramethyl-4-piperidinyl)-imino) (Cyasorb® UV 3346); 5-(2,2,6,6-tetramethyl-4-piperidinyl)-2-cyclo-undecyl-oxazole) (Hostavin® N20); 1,1'-(1,2-ethane-di-yl)-bis-(3,3',5,5-tetramethyl-piperazinone), polymethylpropyl-3-oxy-[4(2,2,6, 6-tetramethyl)-piperidinyl]siloxane (Uvasil® 299); 1,2,3,4-butane-tetracarboxylic acid-1,2,3-tris(1,2,2,6,6-pentamethyl-4-piperidinyl)-4-tridecylester, copolymer of alpha-methylstyrene-N-(2,2,6,6-tetramethyl-4-piperidinyl) maleimide and N-stearyl maleimide; D-glucitol, 1,3:2,4-bis-O-(2,2,6,6-tetramethyl-4-piperidinylidene)-(HALS 7); oligomer of 7-oxa-3,20-diazadispiro[5.1.11.2]-heneicosan-21-one-2,2,4,4-tetramethy-1-20-(oxiranylmethyl) (Hostavin® N30); propanedioic acid, [(4-methoxyphenyl)methylene]$_m$ bis(1,2,2,6,6-pentamethyl-4-piperidinyl) ester (Sanduvor® PR 31); formamide, N,N'-1,6-hexanediylbis[N-(2,2,6,6-tetramethyl-4-piperidinyl (Uvinul® 4050H); 1,3,5-triazine-2, 4,6-triarine, N,N'''-[1,2-ethanediylbis[[[4,6-bis[butyl(1,2,2, 6,6-pentamethyl-4-piperidinyl)amino]-1,3,5-triazine-2-yl] imino]-3,1-propanediyl]]bis[N',N''-dibuty-I-N', N''-bis(1,2, 2,6,6-pentamethyl-4-piperidinyl) (Chimassorb® 119 MW 2286); poly[[6-[(1,1,3,33-tetramethylbutypamino]-1,3,5-triazine-2,4-diyl][(2,2,6,6-tetramethyl-4-piperidinyl)-imino]-1,6-hexanediyl[(2,2,6,6-tetramethyl-4-piperidinyl)imino]] (Chimassorb® 944 MW 2000-3000); 1,5-dioxaspiro(5,5) undecane 3,3-dicarboxylic acid, bis(2,2,6,6-tetramethyl-4-piperidinyl) ester (Cyasorb® UV-500); 1,5-dioxaspiro(5,5) undecane 3,3-dicarboxylic acid, bis(1,2,2,6,6-pentamethyl-4-piperidinyl)ester (Cyasorb® UV-516); N-2,2,6,6-tetramethyl-4-piperidinyl-N-amino-oxamide; 4-acryloyloxy-1,2,2, 6,6-pentamethyl-4-piperidine, 1,5,8,12-tetrakis[2',4'-bis(1'', 2'',2'',6'',6''-pentamethyl-4''-piperidin-yl(butyl)amino)-1',3', 5'-triazine-6'-yl]-1,5,8,12-tetraazadodecane, 3-dodecyl-1-(2, 2,6,6-tetramethyl-4-piperidyl)-pyrrolidin-2,5-dione, 1,1'-(1, 2-ethane-di-yl)-bis-(3,3',5,5'-tetra-methyl-piperazinone) (Goodrite® 3034); 1,1,'1''-(1,3,5-triazine-2,4,6-triyltris((cyclohexylimino)-2,1-ethanediyl)tris(3,3,5,5-tetramethylpiperazinone) (Goodrite® 3150); 1,1',1''-(1,3,5-triazine-2,4,6-triyltris((cyclohexylimino)-2,1-ethanediyl)tris(3,3,4,5,5-tetramethylpiperazinone) (Goodrite® 3159); and so forth.

In one particular embodiment, the hindered amine light stabilizer includes an alkyl-substituted piperidyl compound. For example, the compound may be a di- or tri-carboxylic (ester) amide, such as N,N'-bis(2,2,6,6-tetramethyl-4-piperdiyl)-1,3-benzenedicarboxamide (Nylostab® S-EED).

In addition to or in lieu of a hindered amine light stabilizer, the stabilizer system may also include a phosphorous-containing antioxidant. When employed, such antioxidants typically constitute from about 2 wt. % to 50 wt. %, in some embodiments from about 5 wt. % to about 45 wt. %, and in some embodiments, from about 15 wt. % to about 35 wt. % of the stabilizer system. In certain embodiments, for instance, phosphorous-containing antioxidants may constitute from about 0.01 wt. % to about 1 wt. %, in some embodiments from about 0.05 wt. % to about 0.8 wt. %, and in some embodiments, from about 0.1 wt. % to about 0.5 wt. % of the entire polymer composition. When employed, the weight ratio of the heat stabilizer(s) to the phosphorous-containing antioxidant(s) may be selectively controlled to achieve the desired properties, such as within a range of from about 1 to about 5, in some embodiments from about 1.1 to about 4, and in some embodiments, from about 1.5 to about 3.

The phosphorous-containing antioxidant may include, for instance, a phosphonite having the structure:

$$[R—P(OR_1)_2]_m \qquad (1)$$

wherein,

R is a mono- or polyvalent aliphatic, aromatic, or heteroaromatic organic radical, such as a cyclohexyl, phenyl, phenylene, and/or biphenyl radical; and $R_1$ is independently a compound of the structure (II)

(II)

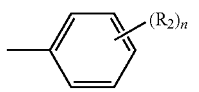

or the two radicals $R_1$ form a bridging group of the structure (III)

(III)

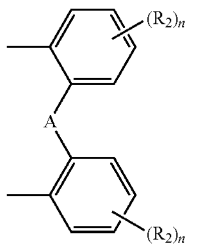

where

A is a direct bond, O, S, $C_{1-18}$ alkylene (linear or branched), or $C_{1-18}$ alkylidene (linear or branched);

$R_2$ is independently $C_{1-12}$ alkyl (linear or branched), $C_{1-12}$ alkoxy, or $C_{5-12}$ cycloalkyl;

n is from 0 to 5, in some embodiments from 1 to 4, and in some embodiments, from 2 to 3, and m is from 1 to 4, in some embodiments from 1 to 3, and in some embodiments, from 1 to 2 (e.g., 2).

Particular preference is given to compounds which, on the basis of the preceding claims, are prepared via a Friedel-Crafts reaction of an aromatic or heteroaromatic system, such as benzene, biphenyl, or diphenyl ether, with phosphorus trihalides, preferably phosphorus trichloride, in the presence of a Friedel-Crafts catalyst, such as aluminum chloride, zinc chloride, iron chloride, etc., and a subsequent reaction with the phenols underlying the structures (II) and (III). Mixtures with phosphites produced in the specified reaction sequence from excess phosphorus trihalide and from the phenols described above are expressly also covered by the invention.

In one particular embodiment, $R_1$ is a group of the structure (II). Among this group of compounds, antioxidants of the general structure (V) are particularly suitable:

(V)

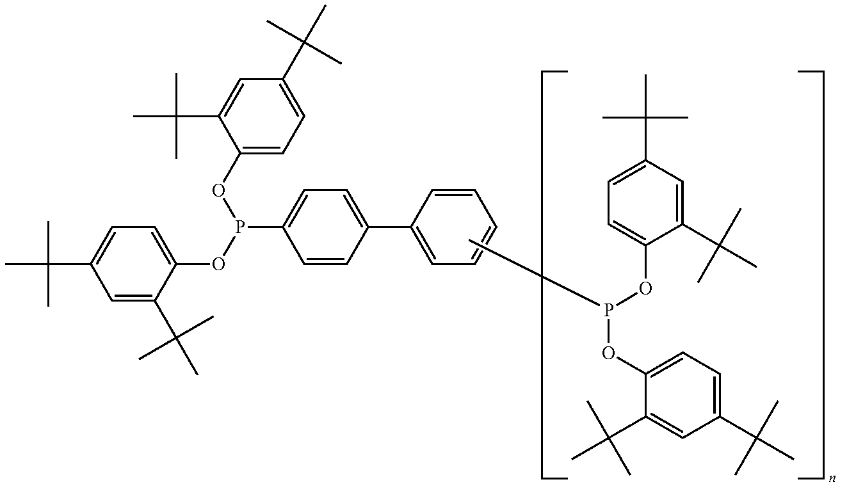

wherein, n is as defined above.

In one particular embodiment, for instance, n in formula (V) is 1 such that the antioxidant is tetrakis(2,4-di-tert-butylphenyl)$_{4,4}$'-biphenylene-diphosphonite.

Although not required, it is typically desired that the stabilizer system includes a combination of a hindered amine light stabilizer and a phosphorous-containing antioxidant. When employed, the weight ratio of phosphorous-containing antioxidant(s) to hindered amine light stabilizer (s) may be selectively controlled to achieve the desired properties, such as within a range of from about 1 to about 5, in some embodiments from about 1.1 to about 4, and in some embodiments, from about 1.5 to about 3.

E. Other Components

A wide variety of additional additives can also be included in the polymer composition, such as impact modifiers, compatibilizers, particulate fillers (e.g., mineral fillers), nucleating agents, lubricants, pigments, colorants, slip additives, and/or other materials added to enhance properties and processability. In one embodiment, for instance, the polymer composition may include a lubricant, such as in an amount from about 0.01 wt. % to about 5 wt. %, in some embodiments from about 0.1 wt. % to about 3 wt. %, and in some embodiments, from about 0.2 wt. % to about 1 wt. % of the polymer composition. When employed, the weight ratio of the heat stabilizer(s) to the lubricant(s) may be selectively controlled to achieve the desired properties, such as within a range of from about 0.5 to about 1.5, in some embodiments from about 0.6 to about 1.4, and in some embodiments, from about 0.8 to about 1.2.

The lubricant is typically derived from a fatty acid and has an acid value of about 6 to about 18 mg KOH/g, in some embodiments about 8 to about 16 mg KOH/g, and in some embodiments, from about 10 to about 14 mg KOH/g as determined in accordance with ISO 2114:2000. For example, the lubricant may be formed from a fatty acid salt derived from fatty acids having a chain length of from 22 to 38 carbon atoms, and in some embodiments, from 24 to 36 carbon atoms. Examples of such fatty acids may include long chain aliphatic fatty acids, such as montanic acid (octacosanoic acid), arachidic acid (arachic acid, icosanic acid, icosanoic acid, n-icosanoic acid), tetracosanoic acid (lignoceric acid), behenic acid (docosanoic acid), hexacosanoic acid (cerotinic acid), melissic acid (triacontanoic acid), erucic acid, cetoleic acid, brassidic acid, selacholeic acid, nervonic acid, etc. For example, montanic acid has an aliphatic carbon chain of 28 atoms and arachidic acid has an aliphatic carbon chain of 20 atoms. Due to the long carbon chain provided by the fatty acid, the lubricant has a high thermostability and low volatility. This allows the lubricant to remain functional during formation of the desired article to reduce internal and external friction, thereby reducing the degradation of the material caused by mechanical/chemical effects.

The fatty acid salt may be formed by saponification of a fatty acid wax to neutralize excess carboxylic acids and form a metal salt. Saponification may occur with a metal hydroxide, such as an alkali metal hydroxide (e.g., sodium hydroxide) or alkaline earth metal hydroxide (e.g., calcium hydroxide). The resulting fatty acid salts typically include an alkali metal (e.g., sodium, potassium, lithium, etc.) or alkaline earth metal (e.g., calcium, magnesium, etc.). Particularly suitable fatty acid salts are derived from crude montan wax, which contains straight-chain, unbranched monocarboxylic acids with a chain length in the range of $C_{28}$-$C_{32}$. Such montanic acid salts are commercially available from Clariant GmbH under the designations Licomont® CaV 102 (calcium salt of long-chain, linear montanic adds) and Licomont® NaV 101 (sodium salt of long-chain, linear montanic acids).

If desired, fatty acid esters may be used in combination with the fatty acid salts. When employed, the molar ratio of the salts to esters is typically about 1:1 or greater, in some embodiments about 1.5 or greater, and in some embodiments, about 2:1 or greater. Fatty acid esters may be obtained by oxidative bleaching of a crude natural wax and subsequent esterification of the fatty acids with an alcohol. The alcohol typically has 1 to 4 hydroxyl groups and 2 to 20 carbon atoms. When the alcohol is multifunctional (e.g., 2 to 4 hydroxyl groups), a carbon atom number of 2 to 8 is particularly desired. Particularly suitable multifunctional alcohols may include dihydric alcohol (e.g., ethylene glycol, propylene glycol, butylene glycol, 1,3-propanediol, 1,4-butanediol, 1,6-hexanediol and 1,4-cyclohexanediol), trihydric alcohol (e.g., glycerol and trimethylolpropane), tetrahydric alcohols (e.g., pentaerythritol and erythritol), and so forth. Aromatic alcohols may also be suitable, such as o-, m- and p-tolylcarbinol, chlorobenzyl alcohol, bromobenzyl alcohol, 2,4-dimethylbenzyl alcohol, 3,5-dimethylbenzyl alcohol, 2,3,5-cumobenzyl alcohol, 3,4,5-trimethylbenzyl alcohol, p-cuminyl alcohol, 1,2-phthalyl alcohol, 1,3-bis (hydroxymethyl)benzene, 1,4-bis(hydroxymethyl)benzene, pseudocumenyl glycol, mesitylene glycol and mesitylene glycerol. Particularly suitable fatty acid esters for use in the present invention are derived from montanic waxes. Licowax® OP (Clariant), for instance, contains montanic adds partially esterified with butylene glycol and montanic acids partially saponified with calcium hydroxide. Thus, Licowax® OP contains a mixture of montanic add esters and calcium montanate. Other montanic acid esters that may be employed include Licowax® E and Licolub® WE 4 (all from Clariant), for instance, are montanic esters obtained as secondary products from the oxidative refining of raw montan wax. Licowax® E and Licolub® \NE 4 contain montanic acids esterified with ethylene glycol or glycerine.

II. Formation

The polyamide, inorganic fibers, flame retardant system, stabilizing system, and other optional additives may be melt processed or blended together. The components may be supplied separately or in combination to an extruder that includes at least one screw rotatably mounted and received within a barrel (e.g., cylindrical barrel) and may define a feed section and a melting section located downstream from the feed section along the length of the screw. The fibers may optionally be added a location downstream from the point at which the polyamide is supplied (e.g., hopper). If desired, the flame retardant(s) and/or other additives may also be added to the extruder a location downstream from the point at which the polyamide is supplied. One or more of the sections of the extruder are typically heated, such as within a temperature range of from about 200° C. to about 450° C., in some embodiments, from about 220° C. to about 350° C., and in some embodiments, from about 250° C. to about 350° C. to form the composition. The speed of the screw may be selected to achieve the desired residence time, shear rate, melt processing temperature, etc. For example, the screw speed may range from about 50 to about 800 revolutions per minute ("rpm"), in some embodiments from about 70 to about 150 rpm, and in some embodiments, from about 80 to about 120 rpm. The apparent shear rate during melt blending may also range from about 100 $seconds^{-1}$ to about 10,000 $seconds^{-1}$, in some embodiments from about 500 $seconds^{-1}$ to about 5000 $seconds^{-1}$, and in some embodiments, from about 800 $seconds^{-1}$ to about 1200 $seconds^{-1}$. The apparent shear rate is equal to $4Q/\pi R^3$, where Q is the volumetric flow rate ("$m^3/s$") of the polymer melt and R is the radius ("m") of the capillary (e.g., extruder die) through which the melted polymer flows.

Regardless of the particular manner in which it is formed, the resulting polymer composition can possess excellent thermal properties. For example, the melt viscosity of the polymer composition may be low enough so that it can readily flow into the cavity of a mold having small dimensions. In one particular embodiment, the polymer composition may have a melt volume flow rate ("MVR") of about 500 $cm^3/10$ in or less, in some embodiments about 250 $cm^3/10$ min or less, and in some embodiments, from about 40 to about 150 $cm^3/10$ min, as determined at a temperature of 275° C. and load of 5 kilograms in accordance with ISO 1133:2011.

III. Product Applications

Due to its unique combination of properties, the polymer composition may be employed in a wide variety of potential product applications. In one embodiment, for instance, the polymer composition may be employed in any of a variety of different parts of an electrical vehicle, such as a high voltage electrical connector, battery pack, etc. The connector may, for example, be employed in the powertrain to accomplish a variety of different purposes. For instance, the high voltage connector may electrically connect a propulsion source (e.g., battery, fuel cell, etc.) to a power electronics module and/or the power electronics module to certain electric machines and/or the transmission. Referring to FIG. 1, for instance, one embodiment of an electric vehicle 12 that includes a powertrain 10 is shown. The powertrain 10 contains one or more electric machines 14 connected to a transmission 16, which in turn is mechanically connected to a drive shaft 20 and wheels 22. Although by no means required, the transmission 16 in this particular embodiment is also connected to an engine 18. The electric machines 14 may be capable of operating as a motor or a generator to provide propulsion and deceleration capability. The powertrain 10 also includes a propulsion source, such as a battery pack 24, which stores and provides energy for use by the electric machines 14. The battery pack 24 typically provides a high voltage current output (e.g., DC current) from one or more battery cell arrays that may include one or more battery cells.

The powertrain 10 may also contain at least one power electronics module 26 that is connected to the battery pack 24 and that may contain a power converter (e.g., inverter, rectifier, voltage converter, etc., as well as combinations thereof). The power electronics module 26 is typically electrically connected to the electric machines 14 and provides the ability to bi-directionally transfer electrical energy between the battery pack 24 and the electric machines 14. For example, the battery pack 24 may provide a DC voltage while the electric machines 14 may require a three-phase AC voltage to function. The power electronics module 26 may convert the DC voltage to a three-phase AC voltage as required by the electric machines 14. In a regenerative mode, the power electronics module 26 may convert the three-phase AC voltage from the electric machines 14 acting as generators to the DC voltage required by the battery pack 24. The description herein is equally applicable to a pure electric vehicle. The battery pack 24 may also provide energy for other vehicle electrical systems. For example, the powertrain may employ a DC/DC converter module 28 that converts the high voltage DC output from the battery pack 24 to a low voltage DC supply that is compatible with other vehicle loads, such as compressors and electric heaters. In a typical vehicle, the low-voltage systems are electrically connected to an auxiliary battery 30 (e.g., 12V battery). A battery energy control module (BECM) 33 may also be present that is in communication with the battery pack 24 that acts as a controller for the battery pack 24 and may include an electronic monitoring system that manages temperature and charge state of each of the battery cells. The battery pack 24 may also have a temperature sensor 31, such as a thermistor or other temperature gauge. The temperature sensor 31 may be in communication with the BECM 33 to provide temperature data regarding the battery pack 24. The temperature sensor 31 may also be located on or near the battery cells within the traction battery 24. It is also contemplated that more than one temperature sensor 31 may be used to monitor temperature of the battery cells.

In certain embodiments, the battery pack 24 may be recharged by an external power source 36, such as an electrical outlet. The external power source 36 may be electrically connected to electric vehicle supply equipment (EVSE) that regulates and manages the transfer of electrical energy between the power source 36 and the vehicle 12. The EVSE 38 may have a charge connector 40 for plugging into a charge port 34 of the vehicle 12. The charge port 34 may be any type of port configured to transfer power from the EVSE 38 to the vehicle 12 and may be electrically connected to a charger or on-board power conversion module 32. The power conversion module 32 may condition the power supplied from the EVSE 38 to provide the proper voltage and current levels to the battery pack 24. The power conversion module 32 may interface with the EVSE 38 to coordinate the delivery of power to the vehicle 12.

As is known to those skilled in the art, a high voltage connector may be employed in the powertrain of an electric vehicle to accomplish a variety of different purposes. Referring again to FIG. 1, for instance, the high voltage connector (not shown) may electrically connect the battery pack 24 to a power electronics module, such as the power electronics module 26, the DC/DC converter module 28, and/or the power conversion module 32. The high voltage connector (not shown) may also electrically connect a power electronics module (e.g., module 32) to certain electric machines 14 and/or the power electronics module and/or electric machines 14 to the transmission 16. Of course, apart from being used in the powertrain, the high voltage connector may also be employed in conjunction with other parts of the electric vehicle. In one embodiment, for instance, the high voltage connector may be employed in the electric vehicle supply equipment, such as the charge connector 40 shown in FIG. 1.

The high voltage connector may have a variety of different configurations depending on the particular application in which it is employed. Typically, however, the connector contains a first connector portion that contains at least one electrical pin and a protection member extending from a base that surrounds at least a portion of the electrical pin. The base and/or the protection member may contain the polymer composition of the present invention. For instance, in certain embodiments, the protection member may have a relatively small wall thickness, such as about 4 millimeters or less, in some embodiments from about 0.2 to about 3.2 millimeters, in some embodiments from about 0.4 to about 2.5 millimeters, and in some embodiments, from about 0.8 to about 2 millimeters. As noted above, the present inventors have discovered that the polymer composition may exhibit good performance even at such low thickness values. The first connector portion may be configured to mate with an opposing second connector portion that contains a receptacle for receiving the electrical pin. In such embodiments, the second connector portion may contain at least one receptable configured to receive the electrical pin of the first connector portion and a protection member extending from a base that surrounds at least a portion of receptacle. The base and/or the protection member of the second connector portion may also contain the polymer composition of the present invention. For instance, in certain embodiments, the thickness of the protection member of the second connector portion may be within the ranges noted above and thus beneficially formed from the polymer composition.

Figure 2:
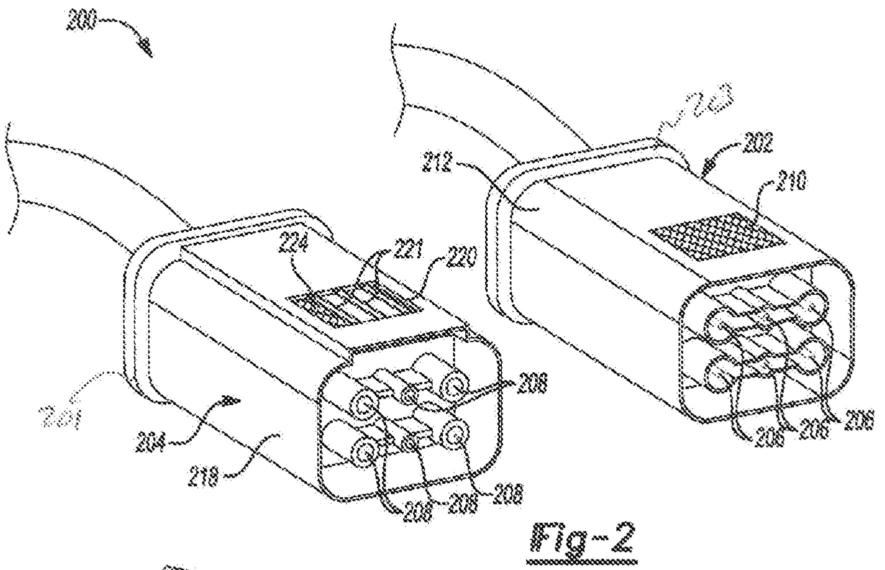
FIG. 2 is a perspective view of one embodiment of a high voltage connector that may employ the polymer composition of the present invention.
Figure 3:
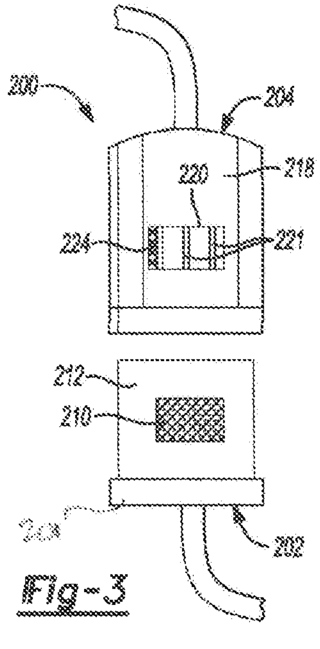
FIG. 3 is a plan view of the high voltage connector of FIG. 2 in which the first and second connector portions are disengaged.
Figure 4:
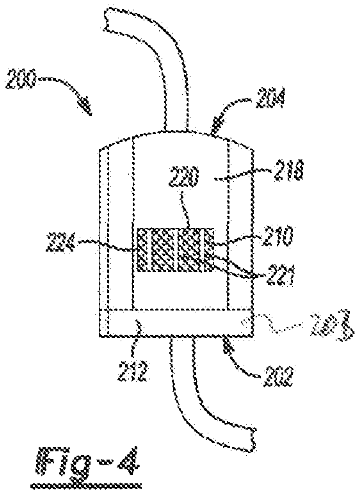
FIG. 4 is a plan view of the high voltage connector of FIG. 2 in which the first and second connector portions are engaged.

Referring to FIGS. 2-4, one particular embodiment of a high voltage connector 200 is shown for use in an electric vehicle. The connector 200 contains a first connector portion 202 and a second connector portion 204. The first connector portion 202 may include one or more electrical pins 206 and the second connector portion 204 may include one or more receptacles 208 for receiving the electrical pins 206. A first protection member 212 may extend from a base 203 of the first connecting portion 202 to surround the pins 206, and similarly, a second protection member 218 may extend from a base 201 of the second connecting portion 204 to surround the receptacles 208. In certain cases, the periphery of the first protective member 212 may extend beyond an end of the electrical pins 203 and the periphery of the second protective member 218 may extend beyond an end of the receptacles 208. As noted above, the base 203 and/or the first protection member 212 of the first connector portion 202, as well as the base 201 and/or the second protection member 218 of the second connector portion 204, may be formed from the polymer composition of the present invention. Such parts may be formed from the polymer composition using a variety of different techniques. Suitable techniques may include, for instance, injection molding, low-pressure injection molding, extrusion compression molding, gas injection molding, foam injection molding, low-pressure gas injection molding, low-pressure foam injection molding, gas extrusion compression molding, foam extrusion compression molding, extrusion molding, foam extrusion molding, compression molding, foam compression molding, gas compression molding, etc. For example, an injection molding system may be employed that includes a mold within which the polymer composition may be injected. The time inside the injector may be controlled and optimized so that polymer matrix is not pre-solidified. When the cycle time is reached and the barrel is full for discharge, a piston may be used to inject the composition to the mold cavity. Compression molding systems may also be employed. As with injection molding, the shaping of the polymer composition into the desired article also occurs within a mold. The composition may be placed into the compression mold using any known technique, such as by being picked up by an automated robot arm. The temperature of the mold may be maintained at or above the solidification temperature of the polymer matrix for a desired time period to allow for solidification. The molded product may then be solidified by bringing it to a temperature below that of the melting temperature. The resulting product may be de-molded. The cycle time for each molding process may be adjusted to suit the polymer matrix, to achieve sufficient bonding, and to enhance overall process productivity.

Although by no means required, the first connector portion 202 may also include an identification mark 210 secured to or defined by the first protective member 212. The second connecting portion 204 may also optionally define an alignment window 220 sized according to the identification mark 210 to more easily determine when the portions are fully mated. For instance, the identification mark 210 may not be readable unless blockers 221 cover a portion of the identification mark 210. Optionally, the second connecting portion 204 may include a supplemental mark 224 located adjacent to the alignment window 220.

Figure 5:
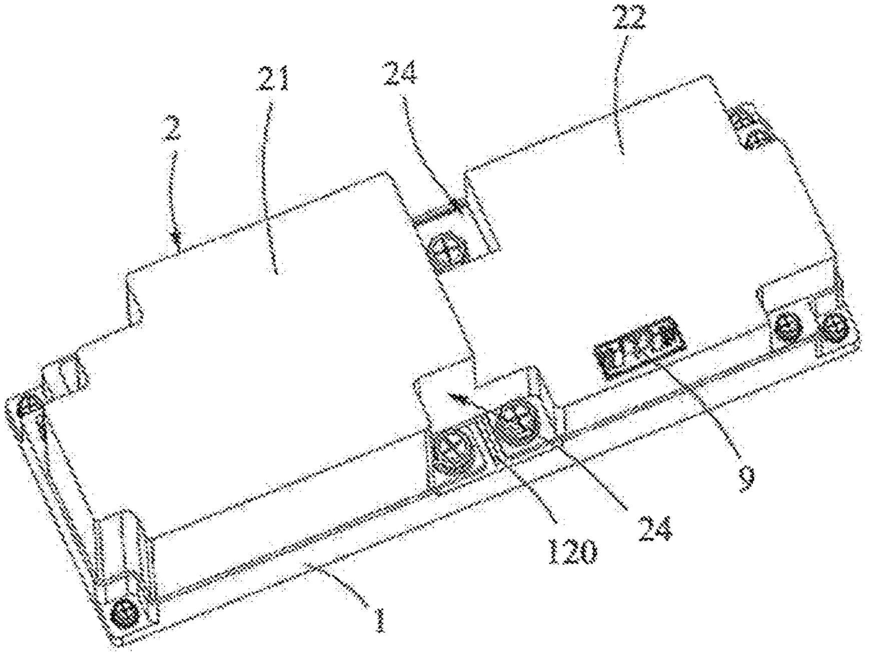
FIG. 5 is a schematic diagram of one embodiment of a power distribution box that may employ the polymer composition of the present invention.
Figure 5:
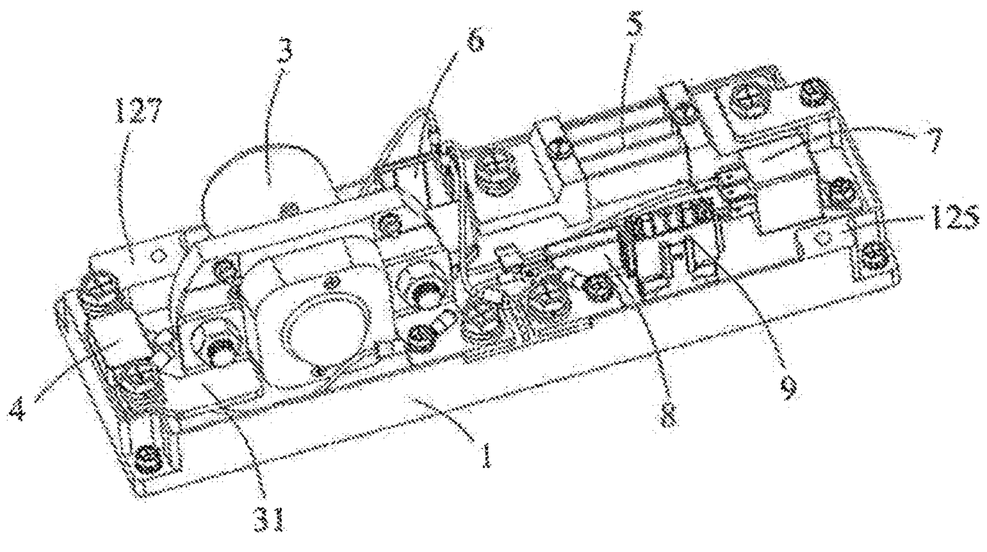

Apart from connectors, various other electric vehicle components may also employ the polymer composition of the present invention. In one embodiment, for example, a battery system of an electric vehicle may include a battery module (e.g., lithium ion battery module) that is electrically connected to a relay box. Typically, such boxes also include other electronic components, such as main relays, main fuses, shunts, heating relays, pre-charging relays, pre-charging resistors, etc. The polymer composition may be used to form one or more components of the battery module, relay box, or a combination thereof. In one embodiment, the relay box may contain a housing that includes the polymer composition. To realize charging and discharging of the battery module, the battery system may include a positive circuit, a negative circuit, a pre-charging circuit and a heating circuit composed of various electrical components. Referring to FIG. 5, for example, one embodiment of a battery system is shown that includes, for example, a main relay 3, main fuse 4, shunt 5, heating relay 6, pre-charging relay 7, and a pre-charging resistor 8. The system may also include a relay box that, in this particular embodiment, is formed from a housing that includes a base 1 and an upper cover 2. Of course, it should also be understood that the box may be an integral component, or may contain other portions. If desired, the base 1 and/or upper cover 2 may include the polymer composition of the present invention.

In the illustrated embodiment, the positive circuit includes the main relay 3 and the main fuse 4 connected in series. The main fuse 4 is electrically connected to the positive output terminal of the battery module (not shown). The upper cover 2 includes a first box cover 21 and a second box cover 22 that communicate with each other, the first box cover 21 covers a first area and the second box cover 22 covers a second area. The first box cover 21 and the second box cover 22 may be connected to form a stepped structure, so that the resulting box has a regular shape. The main fuse 4 may be connected in series with the main relay 3 through a connection row 31 to form a positive circuit, so that the input row of the positive circuit is fixedly supported on the first boss.

The outer side walls of the upper cover 2 have inwardly recessed grooves 24 at corner positions and the positions where the first box cover 21 and the second box cover 22 are connected. The grooves 24 in the upper left corner of the first box cover 21 give way to the input row of the positive circuit, and the grooves 24 in the upper left corner and the upper right corner of the second box cover 22 respectively give way to the input row and output row of the negative circuit. Further, the upper cover 2 and the base 1 are fixedly connected by bolts. Specifically, the diagonal positions of the accommodating groove have bosses 125 and bosses 127, and the diagonal positions of the upper cover 2 are recessed inward to form installation grooves. Preferably, a partition plate 120 is provided on the combination boss and located between the input row of the heating circuit and the output row of the positive circuit, so as to realize the physical insulation of the heating circuit and the positive circuit, and improve the reliability of the power distribution box. In addition, the box further includes an adapter plug 9. The positive circuit, the negative circuit, the heating circuit, and the pre-charging circuit are all connected to an external control unit through the adapter plug 9 for communication, which avoids the chaotic wiring inside the box and reduces the usage of the wiring harness.

The present invention may be better understood with reference to the following examples.

Test Methods

Tensile Modulus, Tensile Stress, and Tensile Elongation at Break

Tensile properties may be tested according to ISO 527:2019 (technically equivalent to ASTM D638-14). Modulus and strength measurements may be made on the same test strip sample having a length of 80 mm, thickness of 10 mm, and width of 4 mm. The testing temperature may be 23° C., and the testing speeds may be 1 or 5 mm/min.

Flexural Modulus and Flexural Stress: Flexural properties may be tested according to ISO Test No. 178:2019 (technically equivalent to ASTM D790-10). This test may be performed on a 64 mm support span. Tests may be run on the center portions of uncut ISO 3167 multi-purpose bars. The testing temperature may be 23° C. and the testing speed may be 2 mm/min.

Charpy Impact Strength: Charpy properties may be tested according to ISO ISO 179-1:2010) (technically equivalent to ASTM D256-10, Method B). This test may be run using a Type 1 specimen size (length of 80 mm, width of 10 mm, and thickness of 4 mm). Specimens may be cut from the center of a multi-purpose bar using a single tooth milling machine. The testing temperature may be 23° C. For "notched" impact strength, this test may be run using a Type A notch (0.25 mm base radius) and Type 1 specimen size (length of 80 mm, width of 10 mm, and thickness of 4 mm).

Comparative Tracking Index ("CTP"): The comparative tracking index (CTI) may be determined in accordance with International Standard IEC 60112-2020 to provide a quantitative indication of the ability of a composition to perform as an electrical insulating material under wet and/or contaminated conditions. In determining the CTI rating of a composition, two electrodes are placed on a molded test specimen. A voltage differential is then established between the electrodes while a 0.1% aqueous ammonium chloride solution is dropped onto a test specimen. The maximum voltage at which five (5) specimens withstand the test period for 50 drops without failure is determined. The test voltages range from 100 to 600 V in 25 V increments. The numerical value of the voltage that causes failure with the application of fifty (50) drops of the electrolyte is the "comparative tracking index." The value provides an indication of the relative track resistance of the material. According to UL746A, a nominal part thickness of 3 mm is considered representative of performance at other thicknesses.

UL94: A specimen is supported in a vertical position and a flame is applied to the bottom of the specimen. The flame is applied for ten (10) seconds and then removed until flaming stops, at which time the flame is reapplied for another ten (10) seconds and then removed. Two (2) sets of five (5) specimens are tested. The sample size is a length of 125 mm, width of 13 mm, and thickness of 0.8 mm. The two sets are conditioned before and after aging. For unaged testing, each thickness is tested after conditioning for 48 hours at 23° C. and 50% relative humidity. For aged testing, five (5) samples of each thickness are tested after conditioning for 7 days at 70° C.

| Vertical Ratings | Requirements |
|---|---|
| V-0 | Specimens must not burn with flaming combustion for more than 10 seconds after either test flame application.<br>Total flaming combustion time must not exceed 50 seconds for each set of 5 specimens.<br>Specimens must not burn with flaming or glowing combustion up to the specimen holding clamp.<br>Specimens must not drip flaming particles that ignite the cotton.<br>No specimen can have glowing combustion remain for longer than 30 seconds after removal of the test flame. |
| V-1 | Specimens must not burn with flaming combustion for more than 30 seconds after either test flame application.<br>Total flaming combustion time must not exceed 250 seconds for each set of 5 specimens.<br>Specimens must not burn with flaming or glowing combustion up to the specimen holding clamp.<br>Specimens must not drip flaming particles that ignite the cotton.<br>No specimen can have glowing combustion remain for longer than 60 seconds after removal of the test flame. |
| V-2 | Specimens must not burn with flaming combustion for more than 30 seconds after either test flame application.<br>Total flaming combustion time must not exceed 250 seconds for each set of 5 specimens. |

-continued

| Vertical Ratings | Requirements |
|---|---|
| | Specimens must not burn with flaming or glowing combustion up to the specimen holding clamp.<br>Specimens can drip flaming particles that ignite the cotton.<br>No specimen can have glowing combustion remain for longer than 60 seconds after removal of the test flame. |

Examples 1-6

Six (6) different polymer composition samples are formed from nylon 6, nylon 6,6, glass fibers, flame retardant system, stabilizer system, lubricant, and silica. The flame retardant system includes 100 wt. % Exolit® OP1312, which includes aluminum phosphinate, melamine polyphosphate, and zinc borate. The stabilizer system includes Bruggolen® TP-H1606 (heat stabilizer containing copper complex-based stabilizer and a brominated synergist), Hostanox® P-EPQ P (tetrakis(2,4-di-tert-butylphenyl)4,4'-biphenylene-diphosphonite), and Nylostab® S-EED (N,N'-bis(2,2,6,6-tetramethyl-4-piperidyl)-1,3-benzenecarboxamide. The lubricant is Licowax® OP F, which is a partly saponified ester wax of montanic acids. The concentration of the components for each of the samples is listed in the table below.

| | Ex. 1 (wt. %) | Ex. 2 (wt. %) | Ex. 3 (wt. %) | Ex. 4 (wt. %) | Ex. 5 (wt. %) | Ex. 6 (wt. %) |
|---|---|---|---|---|---|---|
| Nylon 6,6 | 38.65 | 33.65 | 28.65 | — | — | — |
| Nylon 6 | 20 | 20 | 20 | 58.65 | 53.65 | 48.65 |
| Glass Fibers | 25 | 30 | 35 | 25 | 30 | 35 |
| Exolit ® OP1312 | 15 | 15 | 15 | 15 | 15 | 15 |
| Nylostab ® S-EED | 0.1 | 0.1 | 0.1 | 0.1 | 0.1 | 0.1 |
| Hostanox ® P-EPQ P | 0.2 | 0.2 | 0.2 | 0.2 | 0.2 | 0.2 |
| Bruggolen TPH1606 | 0.5 | 0.5 | 0.5 | 0.5 | 0.5 | 0.5 |
| Licowax OP FL | 0.5 | 0.5 | 0.5 | 0.5 | 0.5 | 0.5 |
| Silica | 0.05 | 0.05 | 0.05 | 0.05 | 0.05 | 0.05 |

After being molded and dried, Examples 1-2 and 4-5 were tested various mechanical properties. The results are set forth in the table below.

| | Ex. 1 | Ex. 2 | Ex. 4 | Ex. 5 |
|---|---|---|---|---|
| Tensile Modulus (MPa) | 8,648 | 9,959 | 8,363 | 9,683 |
| Tensile Strength (MPa) | 130 | 139 | 129 | 139 |
| Elongation at Break (%) | 3.2 | 3.1 | 3.4 | 3.2 |
| Unnotched Charpy at 23° C. ($kJ/m^2$) | 64.1 | 60.8 | 61.9 | 67.3 |
| Notched Charpy at 23° C. ($kJ/m^2$) | 8.5 | 9.5 | 10.5 | 11.4 |
| CTI (V) | 600 | 600 | 600 | 600 |

Examples 1-2 and 4-5 were also subjected to long term heat aging after being molded and dried. In particular, the test specimens were heat aged at 150° C. for 1,000 hours and 200° C. for 2,000 hours. The following results are set forth in the tables below.

| | Ex. 1 | | Ex. 2 | |
|---|---|---|---|---|
| Hours at 150° C. | Charpy notched ($kJ/m^2$) | Ratio of Aged to Initial | Charpy notched ($kJ/m^2$) | Ratio of Aged to Initial |
| 0 | 8.5 | — | 9.5 | — |
| 500 | 7.4 | 0.9 | 8.0 | 0.8 |
| 1000 | 6.9 | 0.8 | 7.7 | 0.8 |
| | **Ex. 3** | | **Ex. 4** | |
| Hours at 150° C. | Charpy notched ($kJ/m^2$) | Ratio of Aged to Initial | Charpy notched ($kJ/m^2$) | Ratio of Aged to Initial |
| 0 | 10.5 | — | 11.4 | — |
| 500 | 8.3 | 0.8 | 9.2 | 0.8 |
| 1000 | 8.6 | 0.8 | 9.4 | 0.8 |

| | Ex. 1 | | Ex. 2 | |
|---|---|---|---|---|
| Hours at 150° C. | Tensile Modulus (MPa) | Ratio of Aged to Initial | Tensile Modulus (MPa) | Ratio of Aged to Initial |
| 0 | 8,648 | — | 9,959 | — |
| 500 | 8,878 | 1.0 | 10,037 | 1.0 |
| 1000 | 8,734 | 1.0 | 9,886 | 1.0 |
| | **Ex. 3** | | **Ex. 4** | |
| Hours at 150° C. | Tensile Modulus (MPa) | Ratio of Aged to Initial | Tensile Modulus (MPa) | Ratio of Aged to Initial |
| 0 | 8,363 | — | 9,683 | — |
| 500 | 8,663 | 1.0 | 10,316 | 1.1 |
| 1000 | 8,691 | 1.0 | 9,896 | 1.0 |

| | Ex. 1 | | Ex. 2 | |
|---|---|---|---|---|
| Hours at 150° C. | Tensile Strength (MPa) | Ratio of Aged to Initial | Tensile Strength (MPa) | Ratio of Aged to Initial |
| 0 | 130 | — | 139 | — |
| 500 | 114 | 0.9 | 120 | 0.9 |
| 1000 | 104 | 0.8 | 107 | 0.8 |
| | **Ex. 3** | | **Ex. 4** | |
| Hours at 150° C. | Tensile Strength (MPa) | Ratio of Aged to Initial | Tensile Strength (MPa) | Ratio of Aged to Initial |
| 0 | 130 | — | 139 | — |
| 500 | 115 | 0.9 | 121 | 0.9 |
| 1000 | 108 | 0.8 | 110 | 0.8 |

| | Ex. 1 | | Ex. 2 | |
|---|---|---|---|---|
| Hours at 150° C. | Tensile Elongation (%) | Ratio of Aged to Initial | Tensile Elongation (%) | Ratio of Aged to Initial |
| 0 | 3.2 | — | 3.1 | — |
| 500 | 1.9 | 0.6 | 1.7 | 0.6 |
| 1000 | 1.7 | 0.5 | 1.4 | 0.5 |

-continued

| Hours at 150° C. | Ex. 3 Tensile Elongation (%) | Ex. 3 Ratio of Aged to Initial | Ex. 4 Tensile Elongation (%) | Ex. 4 Ratio of Aged to Initial |
|---|---|---|---|---|
| 0 | 3.4 | — | 3.2 | — |
| 500 | 1.9 | 0.6 | 1.6 | 0.5 |
| 1000 | 1.7 | 0.5 | 1.4 | 0.4 |

| Hours at 200° C. | Ex. 1 Charpy notched ($kJ/m^2$) | Ex. 1 Ratio of Aged to Initial | Ex. 2 Charpy notched ($kJ/m^2$) | Ex. 2 Ratio of Aged to Initial |
|---|---|---|---|---|
| 0 | 8.5 | — | 9.5 | — |
| 500 | 5.9 | 0.7 | 6.4 | 0.7 |
| 1000 | 4.2 | 0.5 | 5.8 | 0.6 |
| 2000 | 2.5 | 0.3 | 3.8 | 0.4 |

| Hours at 200° C. | Ex. 3 Charpy notched ($kJ/m^2$) | Ex. 3 Ratio of Aged to Initial | Ex. 4 Charpy notched ($kJ/m^2$) | Ex. 4 Ratio of Aged to Initial |
|---|---|---|---|---|
| 0 | 10.5 | — | 11.4 | — |
| 500 | 6.6 | 0.6 | 7.4 | 0.7 |
| 1000 | 6.7 | 0.6 | 6.8 | 0.6 |
| 2000 | 3.7 | 0.4 | 4.5 | 0.4 |

| Hours at 200° C. | Ex. 1 Tensile Modulus (MPa) | Ex. 1 Ratio of Aged to Initial | Ex. 2 Tensile Modulus (MPa) | Ex. 2 Ratio of Aged to Initial |
|---|---|---|---|---|
| 0 | 8,648 | — | 9,959 | — |
| 500 | 9,251 | 1.1 | 10,796 | 1.1 |
| 1000 | 8,801 | 1.0 | 10,466 | 1.1 |
| 2000 | 6,809 | 0.8 | 8,824 | 0.9 |

| Hours at 200° C. | Ex. 3 Tensile Modulus (MPa) | Ex. 3 Ratio of Aged to Initial | Ex. 4 Tensile Modulus (MPa) | Ex. 4 Ratio of Aged to Initial |
|---|---|---|---|---|
| 0 | 8,363 | — | 9,683 | — |
| 500 | 9,424 | 1.1 | 10,858 | 1.1 |
| 1000 | 9,511 | 1.1 | 10,583 | 1.1 |
| 2000 | 8,634 | 1.0 | 10,000 | 1.0 |

| Hours at 200° C. | Ex. 1 Tensile Strength (MPa) | Ex. 1 Ratio of Aged to Initial | Ex. 2 Tensile Strength (MPa) | Ex. 2 Ratio of Aged to Initial |
|---|---|---|---|---|
| 0 | 130 | — | 139 | — |
| 500 | 98 | 0.8 | 101 | 0.7 |
| 1000 | 68 | 0.5 | 81 | 0.6 |
| 2000 | 18 | 0.1 | 27 | 0.2 |

-continued

| Hours at 200° C. | Ex. 3 Tensile Strength (MPa) | Ex. 3 Ratio of Aged to Initial | Ex. 4 Tensile Strength (MPa) | Ex. 4 Ratio of Aged to Initial |
|---|---|---|---|---|
| 0 | 130 | — | 139 | — |
| 500 | 103 | 0.8 | 107 | 0.8 |
| 1000 | 91 | 0.7 | 92 | 0.7 |
| 2000 | 40 | 0.3 | 46 | 0.3 |

| Hours at 200° C. | Ex. 1 Tensile Elongation (%) | Ex. 1 Ratio of Aged to Initial | Ex. 2 Tensile Elongation (%) | Ex. 2 Ratio of Aged to Initial |
|---|---|---|---|---|
| 0 | 3.2 | — | 3.1 | — |
| 500 | 1.4 | 0.4 | 1.2 | 0.4 |
| 1000 | 0.9 | 0.3 | 0.9 | 0.3 |
| 2000 | 0.3 | 0.1 | 0.3 | 0.1 |

| Hours at 200° C. | Ex. 3 Tensile Elongation (%) | Ex. 3 Ratio of Aged to Initial | Ex. 4 Tensile Elongation (%) | Ex. 4 Ratio of Aged to Initial |
|---|---|---|---|---|
| 0 | 3.4 | — | 3.2 | — |
| 500 | 1.3 | 0.4 | 1.2 | 0.4 |
| 1000 | 1.1 | 0.3 | 1.0 | 0.3 |
| 2000 | 0.1 | 0.0 | 0.5 | 0.2 |

Examples 7-10

Four (4) polymer composition samples are formed from nylon 6, nylon 6,6, glass fibers, flame retardant system, stabilizer system, lubricant, and silica. The flame retardant system includes DEPAL (aluminum phosphinate) and either melamine poly(zinc phosphate) or melamine poly(magnesium phosphate). The stabilizer system includes Bruggolen® TP-H1606 (heat stabilizer containing copper complex-based stabilizer and a brominated synergist), Hostanox® P-EPQ P (tetrakis(2,4-di-tert-butylphenyl)4,4'-biphenylene-diphosphonite), and Nylostab® S-EED (N,N'-bis(2,2,6,6-tetramethyl-4-piperidyl)-1,3-benzenecarboxamide. The concentration of the components for each of the samples is listed in the table below.

| | Ex. 7 (wt. %) | Ex. 8 (wt. %) | Ex. 9 (wt. %) | Ex. 10 (wt. %) |
|---|---|---|---|---|
| Nylon 6,6 | 13.65 | — | 50.65 | — |
| Nylon 6 | 20.00 | 33.65 | — | 50.65 |
| Glass Fibers | 30 | 30 | 30 | 30 |
| DEPAL | 14.7 | 14.7 | 12 | 12 |
| Melamine Poly(Zinc Phosphate) | 7.3 | 7.3 | — | — |
| Melamine Poly(Magnesium Phosphate) | — | — | 6 | 6 |
| Licowax OP FL | 0.5 | 0.5 | 0.5 | 0.5 |
| Nylostab ® S-EED | 0.1 | 0.1 | 0.1 | 0.1 |
| Hostanox ® P-EPQ P | 0.2 | 0.2 | 0.2 | 0.2 |
| Bruggolen TPH1606 | 0.5 | 0.5 | 0.5 | 0.5 |
| Silica | 0.05 | 0.05 | 0.05 | 0.05 |

After being dried and molded, the samples above were tested for flame retardancy, CTI, and various mechanical properties. The results are set forth in the tables below.

| | Ex. 7 | Ex. 8 | Ex. 9 | Ex. 10 |
|---|---|---|---|---|
| UL94 Rating (0.4 mm) | V0 | V0 | V0 | — |
| UL94 Rating (0.8 mm) | V0 | V0 | V0 | — |
| UL94 Rating (1.6 mm) | V0 | V0 | V0 | V0 |
| CTI (volts) | 600 | 600 | 550 | 500 |
| Unnotched Charpy at 23° C. ($kJ/m^2$) | 61.6 | 64.1 | 73 | 66.3 |
| Notched Charpy at 23° C. ($kJ/m^2$) | 8.1 | 9.5 | 8.6 | 8.8 |

Examples 7 and 8 were also subjected to long term heat aging after being dried and molded. In particular, the test specimens were heat aged at 200° C. for 1,500 hours. The following results were obtained.

| | Ex. 7 | | Ex. 8 | |
|---|---|---|---|---|
| Hours at 200° C. | Charpy notched ($kJ/m^2$) | Ratio of Aged to Initial | Charpy notched ($kJ/m^2$) | Ratio of Aged to Initial |
| 0 | 9.9 | — | 9.5 | — |
| 250 | 7.1 | 0.7 | 6.6 | 0.7 |
| 500 | 6.4 | 0.7 | 5.9 | 0.6 |
| 1000 | 6.1 | 0.6 | 5.0 | 0.5 |
| 1500 | 4.6 | 0.5 | 4.4 | 0.5 |

| | Ex. 7 | | Ex. 8 | |
|---|---|---|---|---|
| Hours at 200° C. | Tensile Strength (MPa) | Ratio of Aged to Initial | Tensile Strength (MPa) | Ratio of Aged to Initial |
| 0 | 118.8 | — | 140 | — |
| 250 | 91.8 | 0.8 | 91.5 | 0.8 |
| 500 | 89.4 | 0.8 | 89.7 | 0.8 |
| 1000 | 77.9 | 0.7 | 82.6 | 0.7 |
| 1500 | 53.9 | 0.5 | 71.9 | 0.6 |

Examples 11-14

Four (4) polymer composition samples are formed from nylon 6, nylon 6,6, recycled nylon, glass fibers, flame retardant system, stabilizer system, lubricant, and silica. The flame retardant system includes DEPAL (aluminum phosphinate) and melamine poly(zinc phosphate). The stabilizer system includes Bruggolen® TP-H1606 (heat stabilizer containing copper complex-based stabilizer and a brominated synergist), Hostanox® P-EPQ P (tetrakis(2,4-di-tert-butylphenyl)4,4'-biphenylene-diphosphonite), and Nylostab® S-EED (N,N'-bis(2,2,6,6-tetramethyl-4-piperidyl)-1,3-benzenecarboxamide. The concentration of the components for each of the samples is listed in the table below

| | Ex. 11 (wt. %) | Ex. 12 (wt. %) | Ex. 13 (wt. %) | Ex. 14 (wt. %) |
|---|---|---|---|---|
| Nylon 6,6 | 15.65 | 15.65 | 15.65 | — |
| Nylon 6 | 20.00 | 20.00 | 20.00 | 15.00 |
| Recycled Nylon | 15.00 | 15.00 | 15.00 | 35.65 |
| Glass Fibers | 30 | 30 | 30 | 30 |
| DEPAL | 12 | 12 | 12 | 12 |
| Melamine Poly(Zinc Phosphate) | 6 | 6 | 6 | 6 |
| Licowax OP FL | 0.5 | 0.5 | 0.5 | 0.5 |
| Nylostab ® S-EED | 0.1 | 0.1 | 0.1 | 0.1 |

-continued

| | Ex. 11 (wt. %) | Ex. 12 (wt. %) | Ex. 13 (wt. %) | Ex. 14 (wt. %) |
|---|---|---|---|---|
| Hostanox ® P-EPQ P | 0.2 | 0.2 | 0.2 | 0.2 |
| Bruggolen TPH1606 | 0.5 | 0.5 | 0.5 | 0.5 |
| Silica | 0.05 | 0.05 | 0.05 | 0.05 |

After being dried and molded, the samples above were tested for flame retardancy, CTI, and various mechanical properties. The results are set forth in the tables below.

| | Ex. 11 | Ex. 12 | Ex. 13 | Ex. 14 |
|---|---|---|---|---|
| UL94 Rating (0.4 mm) | V0 | V0 | V0 | — |
| UL94 Rating (0.8 mm) | V0 | V0 | V0 | V0 |
| UL94 Rating (1.6 mm) | V0 | V0 | V0 | V0 |
| CTI (volts) | 600 | 550 | 550 | 600 |
| Tensile Modulus at 23° C. (MPa) | 9,940 | 10,389 | 10,200 | 10,279 |
| Tensile Strength at 23° C. (MPa) | 124.5 | 137.4 | 121.7 | 117.8 |
| Tensile Elongation at 23° C. (%) | 2.6 | 2.9 | 2.4 | 2.5 |
| MVR at 275° C./5 kg ($cm^3/10$ min) | 111.1 | 56.2 | 64.5 | 167.9 |

Examples 11-14 were also subjected to long term heat aging after being dried and molded. In particular, the test specimens were heat aged at 140° C. and 200° C. for 2,000 hours. The results are set forth in the tables below.

| | Ex. 11 | Ex. 12 | Ex. 13 | Ex. 14 |
|---|---|---|---|---|
| 500 hrs, 140° C. | | | | |
| Tensile Modulus (MPa) | 9,634 | 10,479 | 10,109 | 10,470 |
| Tensile Strength (MPa) | 112.7 | 134.6 | 113.4 | 116.6 |
| Tensile Elongation (%) | 1.9 | 2.6 | 1.9 | 1.9 |
| 1000 hrs, 140° C. | | | | |
| Tensile Modulus (MPa) | 9,496 | 10,317 | 10,004 | 10,281 |
| Tensile Strength (MPa) | 94.9 | 111.1 | 93.2 | 97.0 |
| Tensile Elongation (%) | 1.3 | 1.6 | 1.3 | 1.3 |

| | Ex. 11 | Ex. 12 | Ex. 13 | Ex. 14 |
|---|---|---|---|---|
| 500 hrs, 140° C. | | | | |
| Ratio of Aged to Initial Tensile Modulus | 1.0 | 1.00 | 1.0 | 1.0 |
| Ratio of Aged to Initial Tensile Strength | 0.9 | 0.98 | 0.9 | 1.0 |
| Ratio of Aged to Initial Tensile Elongation | 0.7 | 0.89 | 0.8 | 0.8 |
| 1000 hrs, 140° C. | | | | |
| Ratio of Aged to Initial Tensile Modulus | 1.0 | 0.99 | 1.0 | 1.0 |
| Ratio of Aged to Initial Tensile Strength | 0.8 | 0.81 | 0.8 | 0.8 |
| Ratio of Aged to Initial Tensile Elongation | 0.5 | 0.55 | 0.5 | 0.5 |

| | Ex. 11 | Ex. 12 | Ex. 13 | Ex. 14 |
|---|---|---|---|---|
| 500 hrs, 200° C. | | | | |
| Tensile Modulus (MPa) | 9,880 | 11,119 | 10,923 | 11,375 |
| Tensile Strength (MPa) | 94.6 | 102.4 | 95.1 | 89.8 |
| Tensile Elongation (%) | 1.3 | 1.3 | 1.2 | 1.0 |
| 1000 hrs, 200° C. | | | | |
| Tensile Modulus (MPa) | 9,425 | 10,678 | 10,268 | 11,194 |
| Tensile Strength (MPa) | 93.4 | 100.3 | 94.8 | 82.9 |
| Tensile Elongation (%) | 1.4 | 1.3 | 1.3 | 0.9 |

| | Ex. 11 | Ex. 12 | Ex. 13 | Ex. 14 |
|---|---|---|---|---|
| 500 hrs, 200° C. | | | | |
| Ratio of Aged to Initial Tensile Modulus | 1.0 | 1.1 | 1.1 | 1.1 |
| Ratio of Aged to Initial Tensile Strength | 0.8 | 0.8 | 0.8 | 0.8 |
| Ratio of Aged to Initial Tensile Elongation | 0.5 | 0.5 | 0.5 | 0.4 |
| 1000 hrs, 200° C. | | | | |
| Ratio of Aged to Initial Tensile Modulus | 1.0 | 1.0 | 1.0 | 1.1 |
| Ratio of Aged to Initial Tensile Strength | 0.8 | 0.7 | 0.8 | 0.7 |
| Ratio of Aged to Initial Tensile Elongation | 0.5 | 0.5 | 0.5 | 0.4 |

Examples 15-18

Four (4) different polymer composition samples are formed from nylon 6, nylon 6,6, glass fibers, flame retardant system, stabilizer system, lubricant, and silica. The flame retardant system includes DEPAL (aluminum phosphinate) and either melamine poly(zinc phosphate). The stabilizer system includes Bruggolen® TP-H1606, Hostanox® P-EPQ P, and Nylostab® S-EED. The lubricant is Licowax® OP F. The concentration of the components for each of the samples is listed in the table below.

| | Ex. 15 (wt. %) | Ex. 16 (wt. %) | Ex. 17 (wt. %) | Ex. 18 (wt. %) |
|---|---|---|---|---|
| Nylon 6,6 | 35.65 | 30.65 | — | — |
| Nylon 6 | 20.00 | 20.00 | 55.65 | 50.65 |
| Glass Fibers | 25 | 30 | 25 | 30 |
| DEPAL | 12 | 12 | 12 | 12 |
| Melamine Poly(Zinc Phosphate) | 6 | 6 | 6 | 6 |
| Nylostab ® S-EED | 0.1 | 0.1 | 0.1 | 0.1 |
| Hostanox ® P-EPQ P | 0.2 | 0.2 | 0.2 | 0.2 |
| Bruggolen TPH1606 | 0.5 | 0.5 | 0.5 | 0.5 |
| Licowax OP FL | 0.5 | 0.5 | 0.5 | 0.5 |
| Silica | 0.05 | 0.05 | 0.05 | 0.05 |

After being molded and dried, Examples 15-18 were tested various mechanical properties. The results are set forth in the table below.

| | Ex. 15 | Ex. 16 | Ex. 17 | Ex. 18 |
|---|---|---|---|---|
| Tensile Modulus (MPa) | 8,983 | 10,389 | 9,220 | 10,659 |
| Tensile Strength (MPa) | 122 | 131 | 131 | 140 |
| Elongation at Break (%) | 3.0 | 2.9 | 3.0 | 3.1 |
| Unnotched Charpy at 23° C. (kJ/$m^2$) | 55.2 | 55.5 | 58.9 | 64.1 |
| Notched Charpy at 23° C. (kJ/$m^2$) | 7.1 | 7.6 | 8.1 | 9.5 |

Examples 15-18 were also subjected to long term heat aging after being molded and dried. In particular, the test specimens were heat aged at 140° C. and 200° C. for 3,000 hours. The following results are set forth in the tables below.

| | Ex. 15 | | Ex. 16 | |
|---|---|---|---|---|
| Hours at 140° C. | Charpy notched (kJ/$m^2$) | Ratio of Aged to Initial | Charpy notched (kJ/$m^2$) | Ratio of Aged to Initial |
| 0 | 7.1 | — | 7.6 | — |
| 500 | 6.4 | 0.9 | 7.4 | 1.0 |
| 1000 | 6.3 | 0.9 | 7.0 | 0.9 |
| 3000 | 5.8 | 0.8 | 4.0 | 0.5 |
| | Ex. 17 | | Ex. 18 | |
| Hours at 140° C. | Charpy notched (kJ/$m^2$) | Ratio of Aged to Initial | Charpy notched (kJ/$m^2$) | Ratio of Aged to Initial |
| 0 | 8.1 | — | 9.5 | — |
| 500 | 7.5 | 0.9 | 8.2 | 0.9 |
| 1000 | 6.9 | 0.9 | 7.9 | 0.8 |
| 3000 | 6.9 | 0.9 | 7.1 | 0.7 |

| | Ex. 15 | | Ex. 16 | |
|---|---|---|---|---|
| Hours at 140° C. | Tensile Modulus (MPa) | Ratio of Aged to Initial | Tensile Modulus (MPa) | Ratio of Aged to Initial |
| 0 | 8,983 | — | 10,389 | — |
| 500 | 8,619 | 1.0 | 9,949 | 1.0 |
| 1000 | 8,784 | 1.0 | 10,221 | 1.0 |
| 3000 | 8,669 | 1.0 | 9,728 | 0.9 |
| | Ex. 17 | | Ex. 18 | |
| Hours at 140° C. | Tensile Modulus (MPa) | Ratio of Aged to Initial | Tensile Modulus (MPa) | Ratio of Aged to Initial |
| 0 | 9,220 | — | 10,659 | — |
| 500 | 9,072 | 1.0 | 10,630 | 1.0 |
| 1000 | 9,136 | 1.0 | 10,641 | 1.0 |
| 3000 | 9,074 | 1.0 | 10,540 | 1.0 |

| | Ex. 15 | | Ex. 16 | |
|---|---|---|---|---|
| Hours at 140° C. | Tensile Strength (MPa) | Ratio of Aged to Initial | Tensile Strength (MPa) | Ratio of Aged to Initial |
| 0 | 122 | — | 131 | — |
| 500 | 109 | 0.9 | 114 | 0.9 |
| 1000 | 98 | 0.8 | 106 | 0.8 |
| 3000 | 89 | 0.7 | 94 | 0.7 |

-continued

| Hours at 140° C. | Ex. 17 Tensile Strength (MPa) | Ex. 17 Ratio of Aged to Initial | Ex. 18 Tensile Strength (MPa) | Ex. 18 Ratio of Aged to Initial |
|---|---|---|---|---|
| 0 | 131 | — | 140 | — |
| 500 | 117 | 0.9 | 124 | 0.9 |
| 1000 | 108 | 0.8 | 112 | 0.8 |
| 3000 | 99 | 0.8 | 100 | 0.7 |

| Hours at 140° C. | Ex. 15 Tensile Elongation (%) | Ex. 15 Ratio of Aged to Initial | Ex. 16 Tensile Elongation (%) | Ex. 16 Ratio of Aged to Initial |
|---|---|---|---|---|
| 0 | 3.0 | — | 2.9 | — |
| 500 | 2.0 | 0.7 | 1.9 | 0.7 |
| 1000 | 1.7 | 0.6 | 1.5 | 0.5 |
| 3000 | 1.4 | 0.5 | 1.3 | 0.4 |

| Hours at 140° C. | Ex. 17 Tensile Elongation (%) | Ex. 17 Ratio of Aged to Initial | Ex. 18 Tensile Elongation (%) | Ex. 18 Ratio of Aged to Initial |
|---|---|---|---|---|
| 0 | 3.0 | — | 3.1 | — |
| 500 | 2.1 | 0.7 | 1.9 | 0.6 |
| 1000 | 1.8 | 0.6 | 1.6 | 0.5 |
| 3000 | 1.6 | 0.5 | 1.3 | 0.4 |

| Hours at 200° C. | Ex. 15 Charpy notched ($kJ/m^2$) | Ex. 15 Ratio of Aged to Initial | Ex. 16 Charpy notched ($kJ/m^2$) | Ex. 16 Ratio of Aged to Initial |
|---|---|---|---|---|
| 0 | 7.1 | — | 7.6 | — |
| 500 | 5.0 | 0.7 | 5.7 | 0.8 |
| 1000 | 5.0 | 0.7 | 5.9 | 0.8 |
| 3000 | 5.3 | 0.7 | 5.6 | 0.7 |

| Hours at 200° C. | Ex. 17 Charpy notched ($kJ/m^2$) | Ex. 17 Ratio of Aged to Initial | Ex. 18 Charpy notched ($kJ/m^2$) | Ex. 18 Ratio of Aged to Initial |
|---|---|---|---|---|
| 0 | 8.1 | — | 9.5 | — |
| 500 | 5.9 | 0.7 | 6.6 | 0.7 |
| 1000 | 5.9 | 0.7 | 6.2 | 0.7 |
| 3000 | 6.2 | 0.8 | 8.0 | 0.8 |

| Hours at 200° C. | Ex. 15 Tensile Modulus (MPa) | Ex. 15 Ratio of Aged to Initial | Ex. 16 Tensile Modulus (MPa) | Ex. 16 Ratio of Aged to Initial |
|---|---|---|---|---|
| 0 | 8,983 | — | 10,389 | — |
| 500 | 8,838 | 1.0 | 9,994 | 1.0 |
| 1000 | 8,798 | 1.0 | 9,960 | 1.0 |
| 3000 | 8,194 | 0.9 | 8,765 | 0.8 |

-continued

| Hours at 200° C. | Ex. 17 Tensile Modulus (MPa) | Ex. 17 Ratio of Aged to Initial | Ex. 18 Tensile Modulus (MPa) | Ex. 18 Ratio of Aged to Initial |
|---|---|---|---|---|
| 0 | 9,220 | — | 10,659 | — |
| 500 | 9,494 | 1.0 | 11,052 | 1.0 |
| 1000 | 9,492 | 1.0 | 11,159 | 1.0 |
| 3000 | 9,137 | 1.0 | 10,819 | 1.0 |

| Hours at 200° C. | Ex. 15 Tensile Strength (MPa) | Ex. 15 Ratio of Aged to Initial | Ex. 16 Tensile Strength (MPa) | Ex. 16 Ratio of Aged to Initial |
|---|---|---|---|---|
| 0 | 122 | — | 131 | — |
| 500 | 95 | 0.8 | 100 | 0.8 |
| 1000 | 91 | 0.7 | 103 | 0.8 |
| 3000 | 51 | 0.4 | 97 | 0.7 |

| Hours at 200° C. | Ex. 17 Tensile Strength (MPa) | Ex. 17 Ratio of Aged to Initial | Ex. 18 Tensile Strength (MPa) | Ex. 18 Ratio of Aged to Initial |
|---|---|---|---|---|
| 0 | 131 | — | 140 | — |
| 500 | 99 | 0.8 | 101 | 0.7 |
| 1000 | 93 | 0.7 | 97 | 0.7 |
| 3000 | 53 | 0.4 | 76 | 0.5 |

| Hours at 200° C. | Ex. 15 Tensile Elongation (%) | Ex. 15 Ratio of Aged to Initial | Ex. 16 Tensile Elongation (%) | Ex. 16 Ratio of Aged to Initial |
|---|---|---|---|---|
| 0 | 3.0 | — | 2.9 | — |
| 500 | 1.5 | 0.5 | 1.4 | 0.5 |
| 1000 | 1.5 | 0.5 | 1.5 | 0.5 |
| 3000 | 0.7 | 0.2 | 1.7 | 0.6 |

| Hours at 200° C. | Ex. 17 Tensile Elongation (%) | Ex. 17 Ratio of Aged to Initial | Ex. 18 Tensile Elongation (%) | Ex. 18 Ratio of Aged to Initial |
|---|---|---|---|---|
| 0 | 3.0 | — | 3.1 | — |
| 500 | 1.4 | 0.5 | 1.2 | 0.4 |
| 1000 | 1.3 | 0.4 | 1.2 | 0.4 |
| 3000 | 0.6 | 0.2 | 0.7 | 0.2 |

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A polymer composition comprising, based on the total weight of the polymer composition:

from about 20 wt. % to about 70 wt. % of a polymer matrix that includes a polyamide;

from about 10 wt. % to about 50 wt. % of inorganic fibers;

from about 5 wt. % to about 30 wt. % of a flame retardant system that includes an organophosphorous compound; and from about 0.1 wt. % to about 5 wt. % of a stabilizer system that includes a heat stabilizer, wherein the heat stabilizer includes a copper compound and a halogen-containing synergist including a halogen-containing aromatic polymer;

wherein the polymer composition exhibits an initial tensile strength and an aged tensile strength after exposure to temperature of 200° C. for 1,000 hours, wherein the ratio of the aged tensile strength to the initial tensile strength is about 0.5 or more, wherein the initial tensile strength and the aged tensile strength are determined at a temperature of about 23° C. in accordance with ISO 527:2019.

2. The polymer composition of claim 1, wherein the copper compound includes a copper (I) salt, copper (II) salt, copper complex, or a combination thereof.

3. The polymer composition of claim 2, wherein the copper (I) salt includes CuI, CuBr, CuCl, CuCN, $Cu_2O$, or a combination thereof and/or the copper (II) salt includes copper acetate, copper stearate, copper sulfate, copper propionate, copper butyrate, copper lactate, copper benzoate, copper nitrate, CuO, $CuCl_2$, or a combination thereof.

4. The polymer composition of claim 2, wherein the copper complex includes copper acetylacetonate, copper oxalate, copper EDTA, $[Cu(PPh_3)_3X]$, $[Cu_2X(PPH_3)_3]$, $[Cu(PPh_3)X]$, $[Cu(PPh_3)_2X]$, $[CuX(PPh_3)$-2,2'-bypyridine], $[CuX(PPh_3)$-2,2'-biquinoline)], or a combination thereof, wherein $PPh_3$ is triphenylphosphine and X is CI, Br, I, CN, SCN, or 2-mercaptobenzimidazole.

5. The polymer composition of claim 1, wherein the halogen-containing aromatic polymer is a brominated styrene polymer.

6. The polymer composition of claim 1, wherein the polyamide includes an aliphatic polyamide.

7. The polymer composition of claim 6, wherein the polymer matrix includes nylon-6, nylon-6,6, or a combination thereof.

8. The polymer composition of claim 1, wherein the inorganic fibers include glass fibers.

9. The polymer composition of claim 1, wherein the organophosphorous compound includes a phosphinate having the general formula (I) and/or formula (II):

(I)

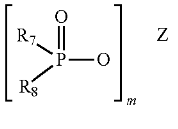

(II)

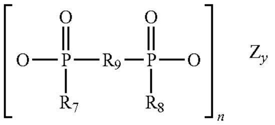

wherein, $R_7$ and $R_8$ are, independently, hydrogen or substituted or unsubstituted, straight chain, branched, or cyclic hydrocarbon groups having 1 to 6 carbon atoms;

$R_9$ is a substituted or unsubstituted, straight chain, branched, or cyclic $C_1$-$C_{10}$ alkylene, arylene, arylalkylene, or alkylarylene group;

Z is Mg, Ca, Al, Sb, Sn, Ge, Ti, Zn, Fe, Zr, Ce, Bi, Sr, Mn, Li, Na, K, and/or a protonated nitrogen base;

y is from 1 to 4;

n is from 1 to 4; and m is from 1 to 4.

10. The polymer composition of claim 9, wherein the phosphinate is a metal salt of dimethylphosphinic acid, ethylmethylphosphinic acid, diethylphosphinic acid, methyl-n-propylphosphinic acid, methane-di(methylphosphinic acid), ethane-1,2-di(methylphosphinic acid), hexane-1,6-di(methylphosphinic acid), benzene-1,4-di(methylphosphinic acid), methylphenylphosphinic acid, diphenylphosphinic acid, hypophosphoric acid, or a mixture thereof.

11. The polymer composition of claim 9, wherein the phosphinate includes zinc diethylphosphinate, aluminum diethylphosphinate, or a combination thereof.

12. The polymer composition of claim 1, wherein the flame retardant system further includes an organophosphorous synergist.

13. The polymer composition of claim 12, wherein the organophosphorous synergist includes an azine phosphate salt.

14. The polymer composition of claim 13, wherein the azine phosphate salt includes melamine pyrophosphate, melamine polyphosphate, piperazine orthophosphate, piperazine pyrophosphate, piperazine polyphosphate, or a combination thereof.

15. The polymer composition of claim 12, wherein the organophosphorous synergist includes an azine metal phosphate salt, azine poly(metal phosphate), or a combination thereof.

16. The polymer composition of claim 12, wherein the organophosphorous synergist include an azine poly(metal phosphate salt) that includes melamine poly(zinc phosphate), melamine poly(magnesium phosphate), or a combination thereof.

17. The polymer composition of claim 1, wherein the flame retardant system further includes an inorganic compound.

18. The polymer composition of claim 1, wherein a halogen content of the flame retardant system is about 1,000 parts per million or less.

19. The polymer composition of claim 1, wherein the stabilizer system further includes a hindered amine light stabilizer.

20. The polymer composition of claim 19, wherein the hindered amine light stabilizer contains one or more of the following general structures:

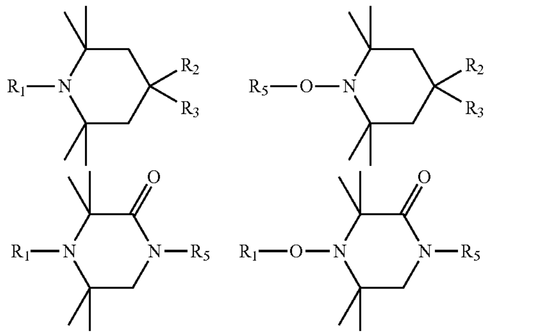

wherein, $R_1$, $R_2$, $R_3$, and $R_5$ are independently hydrogen, ether groups, ester groups, amine groups, amide groups, alkyl groups, alkenyl groups, alkynyl groups, aralkyl groups, cycloalkyl groups and aryl groups, in which the groups are unsubstituted or substituted with functional groups selected from alcohols, ketones, anhydrides, imines, siloxanes, ethers, carboxyl groups, aldehydes, esters, amides, imides, amines, nitriles, ethers, urethanes, or any combination thereof.

21. The polymer composition of claim 19, wherein the hindered amine light stabilizer includes an alkyl substituted piperidyl compound.

22. The polymer composition of claim 21, wherein the hindered amine light stabilizer includes N,N'-bis(2,2,6,6-tetramethyl-4-piperdinyl)-1,3-benzenedicarboxamide.

23. The polymer composition of claim 1, wherein the stabilizer system further includes a phosphorous-containing antioxidant that includes a phosphonite having the structure:

$$[R—P(OR_1)_2]_m \quad (1)$$

wherein,

R is a mono- or polyvalent aliphatic, aromatic, or heteroaromatic organic radical; and $R_1$ is independently a compound of the structure (II)

(II)

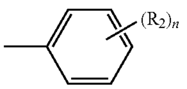

or the two radicals $R_1$ form a bridging group of the structure (III)

(III)

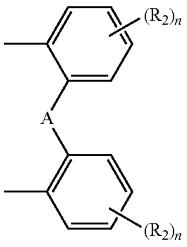

where

A is a direct bond, O, S, $C_{1-18}$ alkylene (linear or branched), or $C_{1-18}$ alkylidene (linear or branched);

$R_2$ is independently $C_{1-12}$ alkyl (linear or branched), $C_{1-12}$ alkoxy, or $C_{5-12}$ cycloalkyl;

n is from 0 to 5, and m is from 1 to 4.

24. The polymer composition of claim 23, wherein R is a cyclohexyl, phenyl, phenylene, or biphenyl radical, and $R_1$ a group of the structure (II).

25. The polymer composition of claim 23, wherein m is 2 and n is from 2 to 3.

26. The polymer composition of claim 23, wherein the phosphorous-containing antioxidant includes tetrakis(2,4-di-tert-butylphenyl) 4,4'-biphenylene-diphosphonite.

27. The polymer composition of claim 1, further comprising from about 0.01 wt. % to about 5 wt. % of a lubricant.

28. The polymer composition of claim 27, wherein the lubricant has an acid value of from about 6 to about 18 mg KOH/g as determined in accordance with ISO 2114:2000.

29. The polymer composition of claim 27, wherein the lubricant contains a salt and/or ester of a $C_{22-36}$ fatty acid.

30. The polymer composition of claim 29, wherein the fatty acid is montanic acid.

31. The polymer composition of claim 27, wherein the weight ratio of the heat stabilizer to the lubricant is from about 0.5 to about 1.5.

32. The polymer composition of claim 1, wherein the stabilizer system includes a hindered amine light stabilizer and a phosphorous-containing antioxidant.

33. The polymer composition of claim 32, wherein the weight ratio of the heat stabilizer to the phosphorous-containing antioxidant is from about 1 to about 5.

34. The polymer composition of claim 33, wherein the weight ratio of the phosphorous-containing antioxidant to the hindered amine light stabilizer is from about 1 to about 5.

35. The polymer composition of claim 32, wherein the weight ratio of the heat stabilizer to the hindered amine light stabilizer is from about 2 to about 10.

36. The polymer composition of claim 1, wherein at a thickness of from about 0.4 to about 3.2 millimeters, the polymer composition exhibits a V0 rating as determined in accordance with UL94.

37. The polymer composition of claim 1, wherein the polymer composition exhibits a comparative tracking index of about 550 volts or more at a thickness of 3 mm as determined in accordance with IEC 60112:2003.

38. The polymer composition of claim 1, wherein the polymer composition exhibits an initial Charpy notched impact strength and an aged Charpy notched impact strength after exposure to temperature of 200° C. for 1,000 hours, wherein the ratio of the aged Charpy notched impact strength to the initial Charpy notched impact strength is about 0.5 or more, wherein the initial Charpy notched impact strength and the aged Charpy notched strength are determined at a temperature of about 23° C. in accordance with ISO 179:2010.

39. A high voltage connector for an electrical vehicle, the connector comprising a connector portion that includes an electrical pin and a protection member extending from a base and surrounding at least a portion of the electrical pin, wherein the base, protection member, or a combination thereof contain a polymer composition of claim 1.

40. The high voltage connector of claim 39, wherein the protection member has a wall thickness of from about 0.8 to about 2 millimeters.

41. The high voltage connector of claim 39, wherein a periphery of the protective member extends beyond an end of the electrical pin.

42. The high voltage connector of claim 39, wherein the protection member contains the polymer composition.

43. The high voltage connector of claim 39, wherein the connector further comprises a second connector portion that includes a receptacle for receiving the electrical pin and a protection member extending from a base and surrounding at least a portion of the receptacle.

44. The high voltage connector of claim 43, wherein the base of the second connecting portion, the protection member of the second connecting portion, or a combination thereof contains the polymer composition.

45. An electric vehicle comprising a powertrain that includes at least one electric propulsion source and a transmission that is connected to the propulsion source via at least one power electronics module, wherein the electrical vehicle comprises the high voltage connector of claim 39.

46. The electric vehicle of claim 45, wherein the high voltage connector of electrically connects the propulsion source to the power electronics module and/or electrically connects the power electronics module to the transmission.

47. The electric vehicle of claim 46, further comprising a charge connector for plugging into a charge port of the vehicle, wherein the charge connector comprises the high voltage connector.

48. The electric vehicle of claim 46, wherein at least one electric machine electrically connects the power electronics module to the transmission, wherein the high voltage connector electrically connects the power electronics module to the electric machine and/or the electric machine to the transmission.

49. The electric vehicle of claim 45, wherein the propulsion source includes a battery.

50. An electric vehicle comprising a powertrain that includes at least one electric propulsion source and a transmission that is connected to the propulsion source via at least one power electronics module, wherein the electrical vehicle comprises at least one part that contains the polymer composition of claim 1.

51. A battery system for an electric vehicle comprising a battery module and a relay box, wherein the relay box comprises the polymer composition of claim 1.

52. The battery system of claim 51, wherein the relay box comprises a housing that includes the polymer composition.

53. The battery system of claim 52, wherein the housing covers an electronic component that includes a relay, fuse, shunt, resistor, or a combination thereof.

* * * * *